United States Patent
Camponeschi et al.

(10) Patent No.: US 12,494,791 B2
(45) Date of Patent: Dec. 9, 2025

(54) ANALOG-TO-DIGITAL CONVERTER SYSTEM, RECEIVER, BASE STATION, MOBILE DEVICE AND METHOD FOR ANALOG-TO-DIGITAL CONVERSION

(71) Applicant: Intel Corporation, Santa Clara, CA (US)

(72) Inventors: Matteo Camponeschi, Villach (AT); Albert Molina, Novelda (ES); Kannan Rajamani, Basking Ridge, NJ (US); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 18/553,212

(22) PCT Filed: Jun. 25, 2021

(86) PCT No.: PCT/US2021/039028
§ 371 (c)(1),
(2) Date: Sep. 29, 2023

(87) PCT Pub. No.: WO2022/271180
PCT Pub. Date: Dec. 29, 2022

(65) Prior Publication Data
US 2024/0187012 A1  Jun. 6, 2024

(51) Int. Cl.
*H03M 1/06* (2006.01)
*H03M 1/10* (2006.01)
*H03M 1/18* (2006.01)

(52) U.S. Cl.
CPC ....... *H03M 1/0609* (2013.01); *H03M 1/1042* (2013.01); *H03M 1/188* (2013.01)

(58) Field of Classification Search
CPC ............. H03M 1/06; H03M 1/10; H03M 1/18
See application file for complete search history.

(56) References Cited

U.S. PATENT DOCUMENTS 8,411,707 B2 * 4/2013 Molina ............... H03M 1/0872
370/537
8,890,729 B2 * 11/2014 Lewis ................. H03M 1/0673
341/122

(Continued)

FOREIGN PATENT DOCUMENTS

KR     20080019193 A     3/2008

*Primary Examiner* — Lam T Mai
(74) *Attorney, Agent, or Firm* — SPL Patent Attorneys PartG mbB; Kieran O'Leary

(57) ABSTRACT

An analog-to-digital converter (ADC) system is provided. The ADC system includes a first signal path. The first signal path includes a first ADC configured to generate first digital data based on an input signal. The first ADC is a time-interleaved ADC including a plurality of sub-ADCs. The first signal path further includes circuitry configured to output activity data indicating at least which of the plurality of sub-ADCs is currently active. The ADC system further includes a correction circuit configured to output digital correction data based on the activity data. Further, the ADC system includes a second signal path coupled in parallel to the first signal path. The second signal path includes a second ADC configured to generate second digital data based on the input signal and a combiner circuit configured to generate modified second digital data by combining the second digital data and the correction data. The ADC system further includes an equalizer configured to generate an equalized output signal of the ADC system based on the first digital data. The equalizer is configured to adjust, based on the modified second digital data, at least one equalization parameter used for generating the equalized output signal of the ADC system.

20 Claims, 20 Drawing Sheets

(56) References Cited

U.S. PATENT DOCUMENTS

| | | | |
|---|---|---|---|
| 8,922,411 B2* | 12/2014 | Ullmann | H03M 3/392 |
| | | | 341/120 |
| 9,154,146 B1* | 10/2015 | Chiu | H03M 1/1042 |
| 9,461,661 B1* | 10/2016 | Kull | H03M 1/0678 |
| 9,525,427 B1* | 12/2016 | Knierim | G01R 13/0236 |
| 9,722,620 B1* | 8/2017 | Zanbaghi | H03M 1/1004 |
| 10,680,630 B1* | 6/2020 | David | H03M 1/1215 |
| 10,868,554 B1* | 12/2020 | Reitsma | H03M 3/356 |
| 11,038,516 B1* | 6/2021 | Azadet | H03M 1/1009 |
| 2006/0061501 A1* | 3/2006 | Sheng | H04N 21/4263 |
| | | | 341/155 |
| 2007/0171116 A1 | 7/2007 | Fuse et al. | |
| 2011/0080925 A1* | 4/2011 | Molina | H03M 1/0872 |
| | | | 370/538 |
| 2013/0106630 A1* | 5/2013 | Wong | H03M 1/46 |
| | | | 341/110 |
| 2014/0062738 A1* | 3/2014 | Wu | H03M 1/0626 |
| | | | 341/118 |
| 2014/0152478 A1* | 6/2014 | Lewis | H03M 1/0673 |
| | | | 341/123 |
| 2015/0138006 A1* | 5/2015 | Straeussnigg | H03M 1/164 |
| | | | 341/155 |
| 2017/0077939 A1 | 3/2017 | Knierim | |
| 2019/0173479 A1* | 6/2019 | Dyachenko | H03M 1/0641 |
| 2022/0131549 A1* | 4/2022 | Huang | H03M 1/1061 |

* cited by examiner

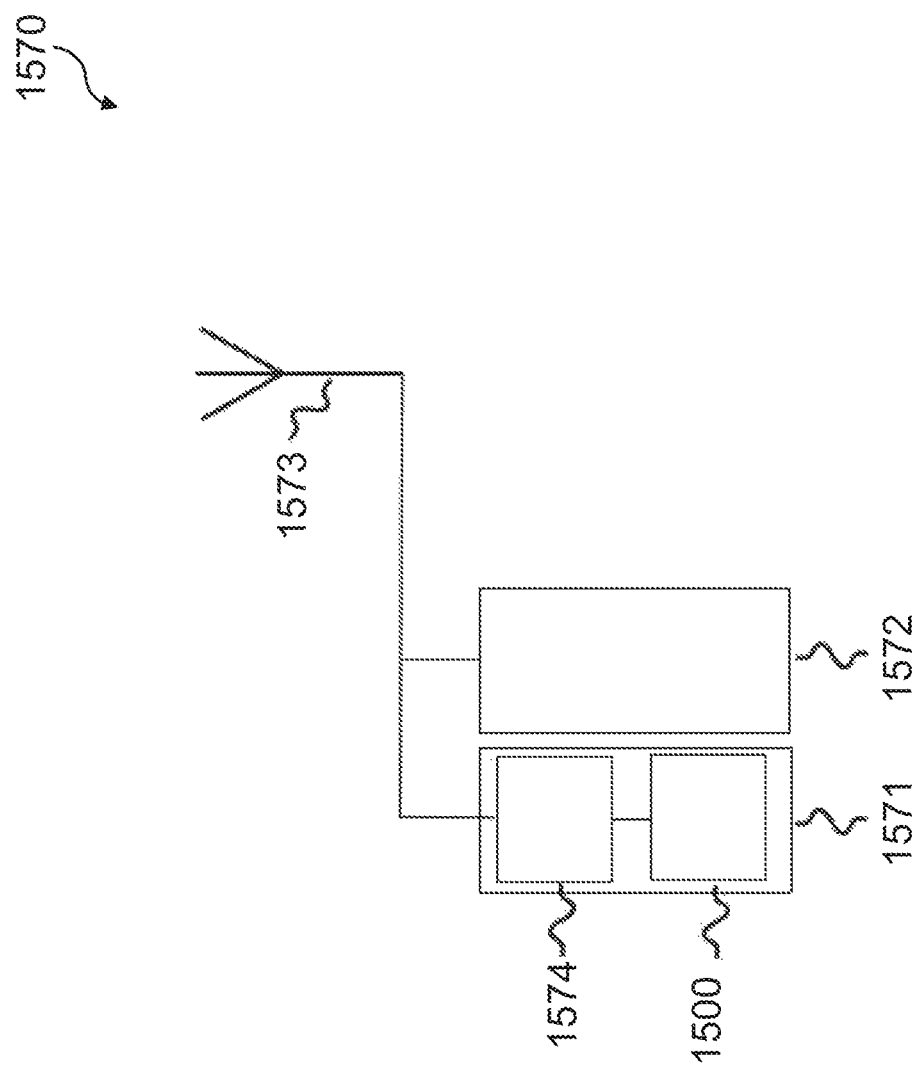

ANALOG-TO-DIGITAL CONVERTER SYSTEM, RECEIVER, BASE STATION, MOBILE DEVICE AND METHOD FOR ANALOG-TO-DIGITAL CONVERSION

FIELD

The present disclosure relates to analog-to-digital conversions. In particular, examples relate to an analog-to-digital converter (ADC) system, a receiver comprising the ADC system, a base station comprising the receiver, a mobile device comprising the receiver and a method for analog-to-digital conversion.

BACKGROUND

Time-interleaved analog-to-digital converters (TI-ADCs) are usually employed to capture wide portions of a radio frequency (RF) spectrum. For example, a receiver front-end comprises a RF input buffer connecting to time-interleaved sub-ADCs. Typically, an equalizer is cascaded to the TI-ADC correcting a non-linearity and memory effects of the receiver. For an optimal performance of the receiver, a second ADC is coupled in parallel to the TI-ADC to sense the signal at the receiver input and create a reference signal to the equalizer. However, the activation of time-interleaved sub-ADCs can generate significant voltage transients electromagnetically coupling to the second ADC and having an impact on the reference signal.

Hence, there may be a desire for an improved analog-to-digital conversion.

BRIEF DESCRIPTION OF THE FIGURES

Some examples of apparatuses and/or methods will be described in the following by way of example only, and with reference to the accompanying figures, in which

FIG. 14b illustrates an output of the equalizer in the frequency domain according to the example of FIG. 14a;

FIG. 15 illustrates an example of a base station;

DETAILED DESCRIPTION

Figure 1:
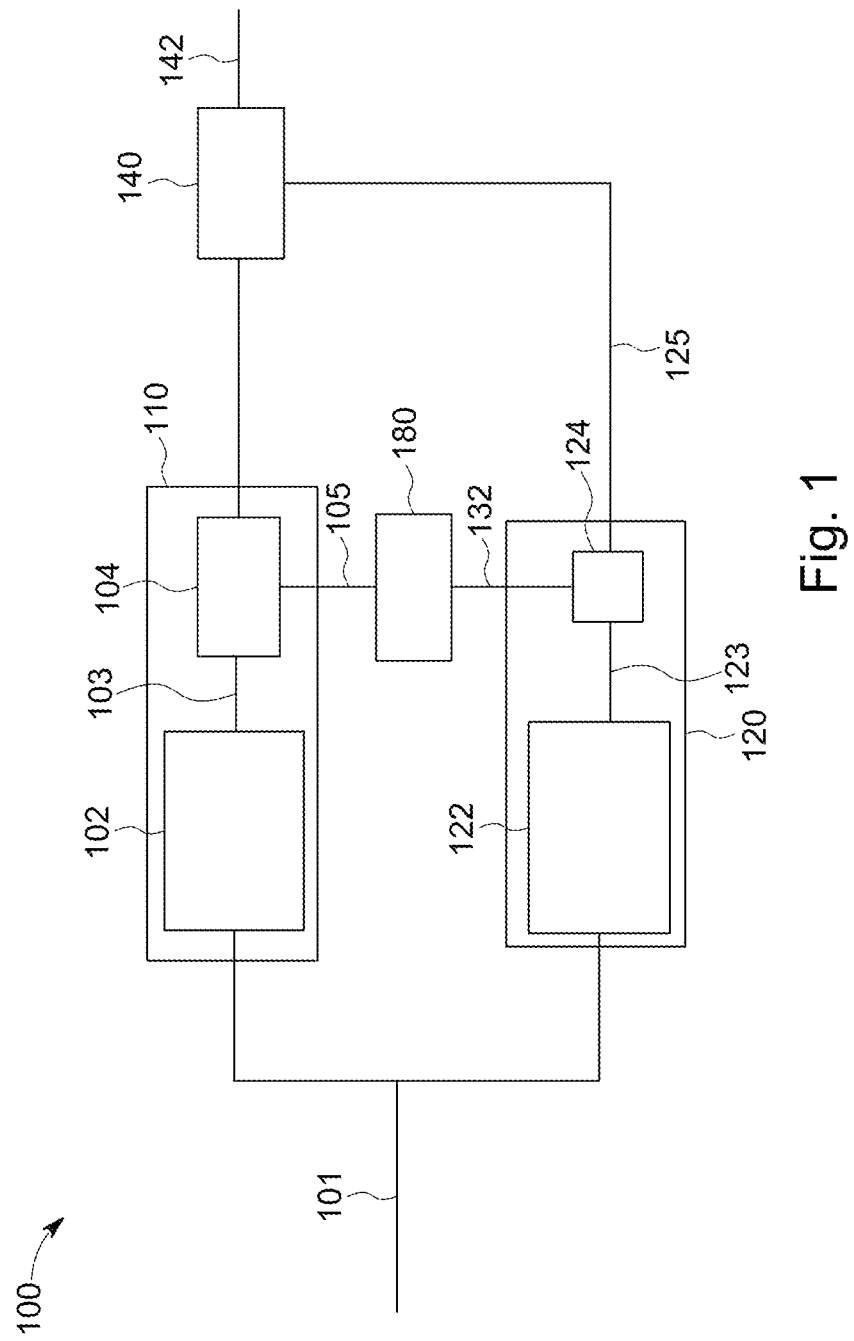
FIG. 1 illustrates an example of an ADC system.

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an example of an ADC system 100. The ADC system 100 comprises a first signal path 110 comprising a first ADC 102 configured to generate first digital data 103 based on an input signal 101. The first ADC 102 is a time-interleaved ADC comprising a plurality of sub-ADCs. The first signal path 110 further comprises circuitry 104 configured to output activity data 105 indicating at least which of the plurality of sub-ADCs is currently active. The ADC system 100 further comprises a correction circuit 130 configured to output digital correction data 132 based on the activity data 105.

Further, the ADC system 100 comprises a second signal path 120 coupled in parallel to the first signal path 110. The second signal path 120 comprises a second ADC 122 configured to generate second digital data 123 based on the input signal 101. The second signal path 120 further comprises a combiner circuit 124 configured to generate modified second digital data 125 by combining the second digital data 123 and the correction data 132. The ADC system 100 further comprises an equalizer 140 configured to generate an equalized output signal 142 of the ADC system 100 based on the first digital data 103. The equalizer 140 is configured to adjust, based on the modified second digital data 125, at least one equalization parameter used for generating the equalized output signal 142 of the ADC system 100.

The first ADC 102 generates the first digital data 103 based on the input signal 101. The plurality of sub-ADCs of the first ADC 102 operate in a time-interleaved manner and generate the first digital data 103. The second ADC 120 may be used as a reference for the equalizer 140. The operation of the first ADC 102 influences the second ADC 122. For example, errors such as spurs or offsets may be caused in the second digital data 123 output by the second ADC 122 due to electromagnetic coupling of the first ADC 102 and second ADC 122. Errors in the second digital data 123 may depend on an operation mode, such as a current activity of a sub-ADC, of the first ADC 102. The circuitry 104 may determine which sub-ADC of the plurality of sub-ADCs is currently active and provide the activity data 105 for the correction circuit 130. The correction circuit 130 receives the activity data 105 and provides the digital correction data 132 which can be used to correct the errors in the second digital data 123. Hence, the second digital data 123 can be corrected before it is provided to the equalizer 140. The combiner circuit 124 combines the second digital data 123 from the second ADC 122 and the correction data 132 from the correction circuit 130 to generate the modified second digital data 125. Compared to the second digital data 123, the modified second digital data 125 may be corrected with respect to errors caused by the crosstalk between the first ADC 102 and the second ADC 122. The equalizer 140 may be used, e.g. to reduce non-linear effects caused by the first ADC 102 and/or a buffer preceding the first ADC 102, by providing the equalized output signal 142 based on the first digital data 103 and the modified second digital data 125. According to the proposed technique, the equalizer 140 can adjust equalized parameters based on the corrected output of the second ADC 122. The equalizer 140 may provide an improved equalized output signal 142 since error-prone components in the second digital data 123, caused by the crosstalk between the first ADC 102 and the second ADC 122, may be corrected (or at least reduced) and therefore not passed to the equalizer 140.

The circuitry 104 may determine which of the plurality of sub-ADCs is currently active (or is currently operating). For example, the circuitry 104 may detect whether circuit components of the sub-ADC such as sampling capacitors or switches are in an active condition or whether a sub-ADC is currently outputting digital data or not. The circuitry 104 outputs activity data 105 indicating at least which of the plurality of sub-ADCs is currently active. As exemplarily indicated in FIG. 1, the circuitry 104 may be configured to determine the activity data 105 based on the first digital data 103. According to another example, the circuitry 104 may determine which of the plurality of the sub-ADCs is currently active based on a different signal than the first digital data 103 such as an external signal or a state signal provided (output) by the first ADC 102. For example, the external signal or the state signal may comprise information on an operation mode of the first ADC 102 e.g. based on a timing. The activity data 105 may optionally further indicate one or more previously active sub-ADCs of the plurality of sub-ADCs. By this, the circuitry 104 may provide a memory or information on a previous operation mode of the first ADC 102. For example, the activity data 105 may comprise information on a sequence of sub-ADCs successively operating in the time-interleaved manner. The information on the sequence may relate to all or a subset of previously activated sub-ADCs of the plurality of sub-ADCs. For example, a subset of sub-ADCs may comprise the (first) last, the second last and/or the third last etc. of sub-ADC(s) with respect to the currently active sub-ADC.

Based on the activity data 105 from the circuitry 104, the correction circuit 130 may supply correction data 132 for appropriate mitigation of errors occurring in the second digital data 123 due to the crosstalk of the first ADC 102 and the second ADC 122. For example, the crosstalk may predominantly occur between a specific sub-ADC being currently active and the second ADC 122. The crosstalk and/or the error may depend on the distance between the specific sub-ADC and the second ADC since electromagnetic coupling may be stronger for a closer distance between the specific sub-ADC and the second ADC 122. The correction circuit 130 may comprise one or more look-up tables (LUTs). The correction circuit 130 may select an entry of the LUT(s) based on one or more sub-ADCs indicated as currently (and optionally previously) active in the activity data 105.

The first ADC 102 (or e.g. main ADC) is a time-interleaved ADC. For example, the first ADC 102 comprises N sub-ADCs which may be called slices. The second ADC 122 may be any type of conventional ADC. The second ADC 122 may be an ADC being separate or independent from the first ADC 102. Alternatively, the second ADC 122 may be a sub-ADC (e.g., an extra sub-ADC) of the time-interleaved ADC 102. The first ADC 102 may be configured to sample the input signal 101 at a first sampling frequency and the second ADC 122 may be configured to sample the input signal 101 at a second sampling frequency being lower than the first sampling frequency. For example, the second sampling frequency is a fraction of the first sampling frequency. The first ADC 102 may be used to provide a digital signal for the analog input signal 101 with appropriate resolution. The first ADC 102 may operate continuously for generating the first digital data 103.

The second ADC 122 (or e.g. observation ADC) may be used to optimize, improve or correct the first digital data generated by the first ADC 102 with respect to errors e.g. due to non-linear effects by the first ADC 102. The second ADC 122 may sample the input signal 101 at random sampling phases. The second ADC 122 may be a single instance (e.g. indicating a single sub-ADC or slice) and may have in general a different architecture compared to the first ADC 102.

The first signal path 110 (e.g. main path) comprises the first ADC 102 and the circuitry 104. The first signal path 110 receives the input signal 101 and provides a digital output (based on the first digital data 103) for the equalizer 140 generating the equalized output signal 142. The first signal path 110 may comprise further electrical components such as a buffer which will be further described below.

The second signal path 120 (e.g. observation path) comprises the second ADC 122 and the combiner circuit 124. The second signal path 120 receives the input signal 101 and provides a digital output (based on the second digital data 123) for the equalizer 140 adjusting at least one equalization parameter. The second signal path 120 may comprise further electrical components such as a buffer or an attenuator which will be further described below.

The combiner circuit 124 combines the second digital data 123 and the correction data 132 such that errors (e.g. spurs) occurring in the second digital data 123 can be mitigated. The combiner circuit 124 may be, e.g. an adder adding the second digital data and an inverted offset related to the crosstalk. According to another example, the combiner circuit 124 may be a subtractor subtracting the offset from the second digital data 123.

The equalizer 140 may use (e.g. sub-sampled) outputs from the second ADC 122 as a reference for calibrating the output of the first ADC 102. A distortion in the output of the first ADC 102 may be incurred due to non-linear effects caused by the first ADC 110 and/or a buffer (not shown in FIG. 1) preceding the first ADC 102. The distortion may be caused by at least one of static mismatch of normally equal circuit elements, gain compression, gain mismatch, sampling timing skew, frequency response mismatch, frequency response flatness, buffer non-linearity, sampler non-linearity, sampler non-linearity mismatch, or the like. The equalizer 140 may be a non-linear equalizer (NLEQ) configured to correct the distortion. The equalizer 140 may adjust equalization parameters, e.g. using a least square (LS) or least mean square (LMS) algorithm based on a difference between the equalized output signal 142 and the output of the second ADC 122. According to the proposed technique, a corrected output of the second ADC 122 may be used as a reference for correcting the output of the first ADC 102.

Although not explicitly illustrated in FIG. 1, the ADC system 100 may comprise additional or optional circuitry (components). For example, the ADC system 100 may comprise one or more buffer circuits to buffer the input signal 101 and/or an attenuator circuit to attenuate the input signal 101. Some exemplary apparatuses showing further details of the proposed technique will be described in the following with reference to FIGS. 2 and 8 to 17.

Figure 2:
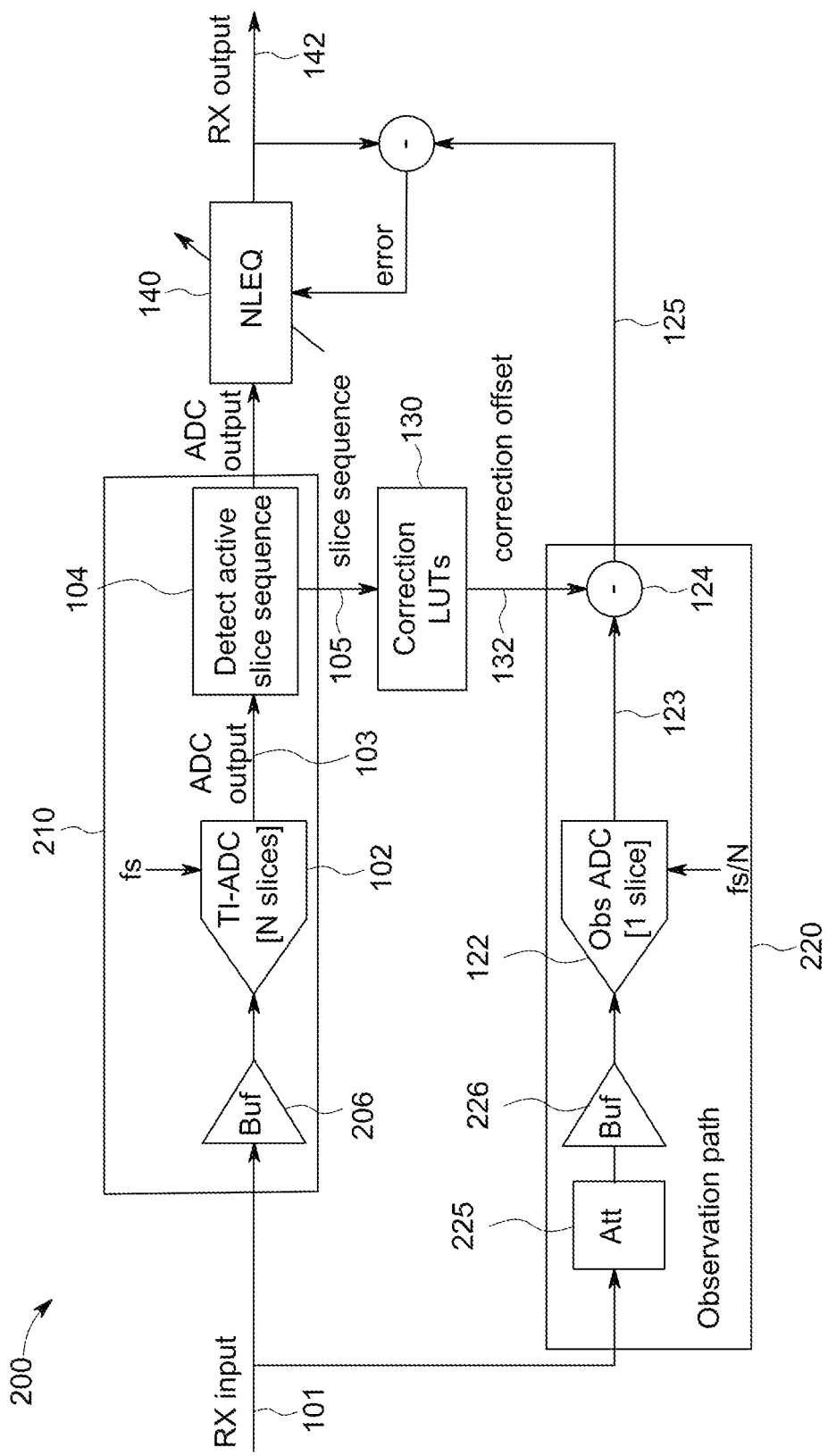
FIG. 2 illustrates another example of an ADC system.

FIG. 2 illustrates a further example of an ADC system 200. The implementation of ADC system 200 may be similar to the implementation of ADC system 100 described in connection with FIG. 1. The ADC system 200 comprises a first signal path 210 which may be similar to the implementation of the first signal path 110 described in connection with FIG. 1. The first signal path 210 further comprises a first buffer circuit 206 configured to buffer the input signal 101. An input of the first ADC 102 is coupled to an output of the first buffer circuit 206. The first ADC 102 may generate the first digital data 103 based on the input signal being buffered.

The ADC system 200 comprises a second signal path 220 which may be similar to the implementation of the second signal path 120 described in connection with FIG. 1. The second signal path 220 further comprises an attenuator circuit 225 configured to attenuate the input signal 101 and a second buffer circuit 226 configured to buffer the input signal 101. An input of the second ADC 122 is coupled to an output of the second buffer circuit 226 and an input of the second buffer 226 circuit is coupled to an output of the attenuator circuit 225. The attenuator circuit 225 may attenuate a power of the input signal 101 to a proper level such that the linearity of the second buffer circuit 226 may be improved.

According to the example, the combiner circuit 124 is configured to generate modified second digital data by subtracting the correction data 132 from the second digital data 123. According to another example, the correction circuit 124 may add the (e.g. negative) correction data 132 to the second digital data 123. The combiner circuit 124 may operate in the digital domain and supplies modified second digital data 125 to the equalizer 140.

As indicated in FIG. 2, the correction circuit 130 comprises at least one LUT. The LUT may comprise entries which can be used to correct a crosstalk caused by a currently (and optionally previously) active sub-ADC of the first ADC 102 with respect to the second ADC 122. Selected entries of the LUT(s) may be used by the correction circuit 130 to mitigate unwanted spurs in the second digital data 123. Since each sub-ADC of the first ADC 102 may have a different distance to the second ADC 122, spurs in the second digital data 123 may be different for the different sub-ADCs being currently active. The sub-ADC(s) in the first ADC 102 may be activated sequentially and periodically (e.g. sub-ADC 0, 1, 2, . . . N−1, 0, 1, 2, . . . etc.). This aspect may be referred in the following as (sequential) slice activation sequence. Spurs in the second digital data 123 may depend on a specific slice activation sequence.

FIG. 2 may refer to a crosstalk suppression scheme in the digital domain. The technique may be a fully-digital correction scheme, capable of removing the crosstalk for any TI-ADC slice activation sequence, including activation sequences that are dynamically changing during the operation of the ADC system. The circuitry 104 may identify the indices of the current or optionally last k sub-ADCs that were activated in the TI-ADC. The set of indices can be used to address one or more correction LUTs that, once combined, determine the value of a correction factor, e.g. to be subtracted at the second ADC output.

For better understanding of the crosstalk between the sub-ADCs of the first ADC 102 and the second ADC 122, aspects of other (conventional) ADC systems are considered in connection with FIG. 3 to FIG. 7.

Figure 3:
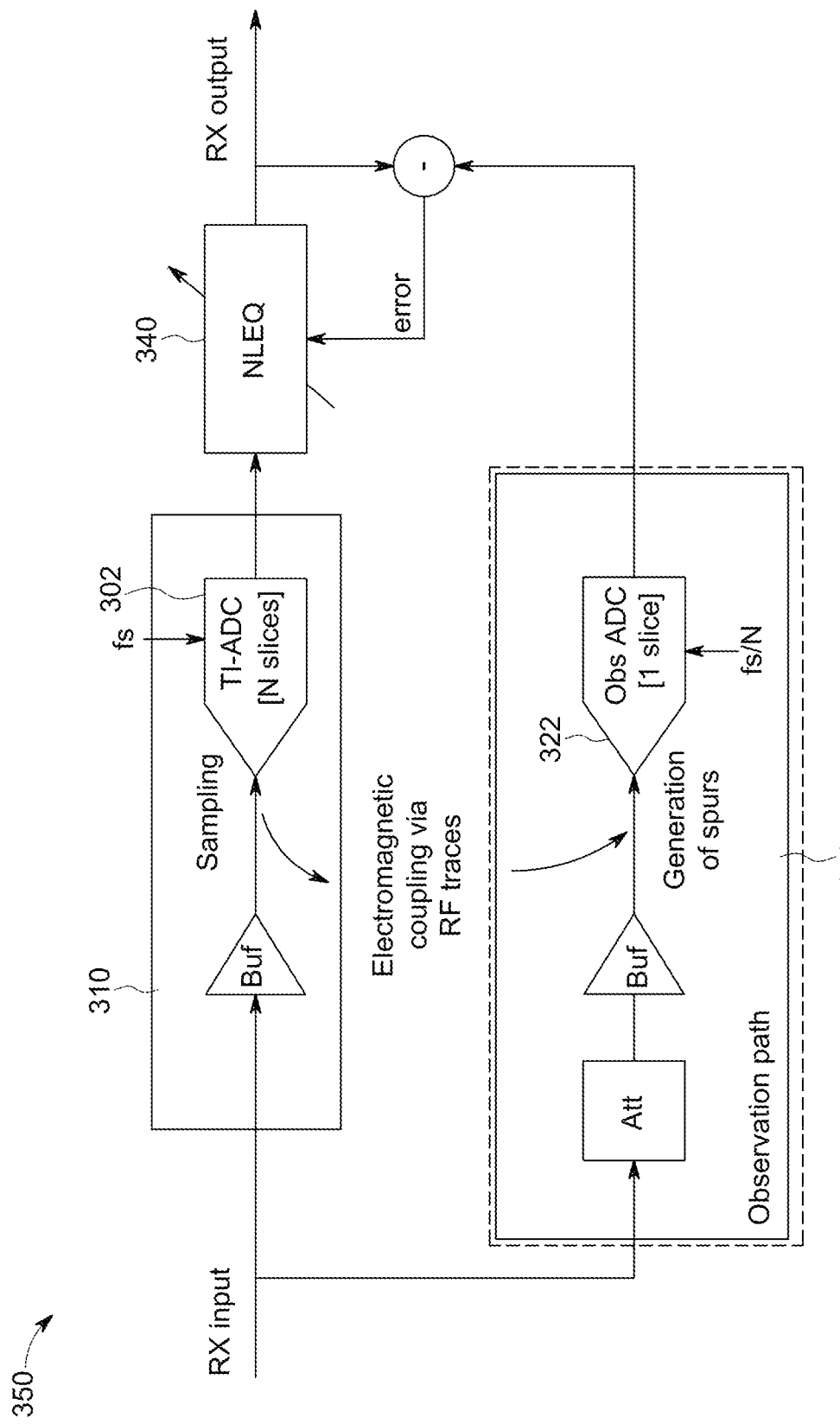
FIG. 3 illustrates an example of a conventional ADC system.

FIG. 3 illustrates an example for a conventional ADC system 350 which does not comprise a correction circuit using activity data. As shown in FIG. 3, a crosstalk between a first ADC 302 and a second ADC 322 is present due to current or previous sampling or activity of one or more sub-ADCs in the first ADC 302. Due to electromagnetic coupling, spurs are generated in the second digital data and are not considered or corrected by means of a correction circuit. The activation of the samplers in the first ADC 102 may generate large voltage and/or current transients that are electromagnetically coupled to a second signal path 320 comprising the second ADC 322. This coupling may generate errors in the output of the second ADC 322. The performance of the ADC system 350 may be reduced by RF coupling between the first ADC 302 and the second ADC 322. The strength of coupling may increase if the currently (and optionally previously) active sub-ADC(s) of the first ADC 302 is located closer to the second ADC 322.

Figure 4:
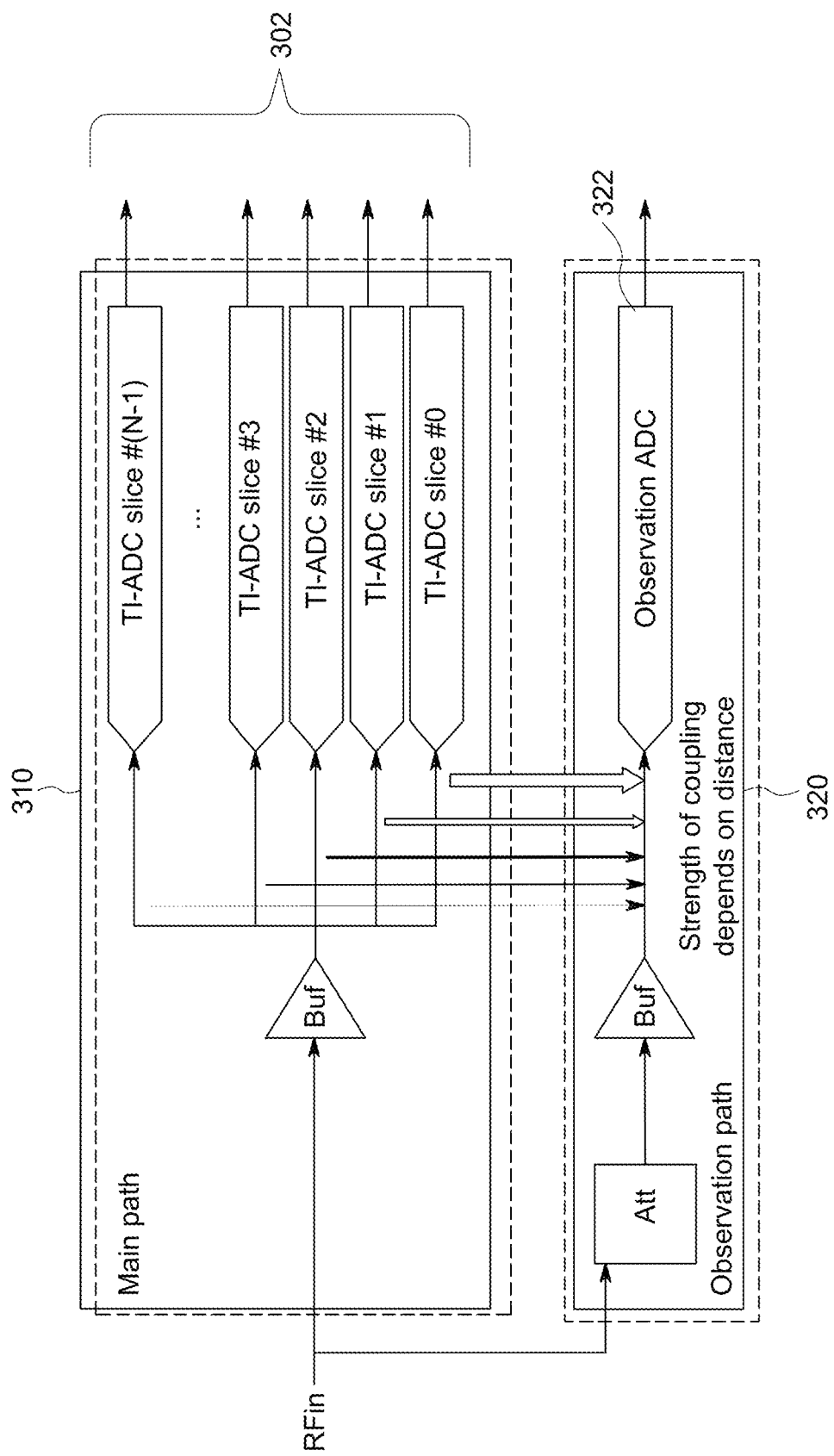
FIG. 4 illustrates an exemplary implementation of the conventional ADC system of FIG. 3.

FIG. 4 illustrates an exemplary implementation of the conventional ADC system 350 described in conjunction with FIG. 3. FIG. 4 shows the strength of electromagnetic coupling dependent on the distance of the sub-ADCs (TI-ADC slice #0 to #(N−1)) with respect to the ADC 322 (observation ADC). The strength of the coupling may be, in first order, proportional to the physical (or geometrical) distance in the layout. When the first ADC 302 is sampling, (exclusively) one of the sub-ADCs of the first ADC 302 may be active. The activation of a (sampler of a) sub-ADC in the first signal path 310 may introduce an error at the input of the second ADC 322. Therefore, each second digital data of the second ADC 322 may be therefore affected by an error.

The output of the second ADC 322 can be used as a reference for an equalizer 340. For example, the equalizer may be an adaptive filter whose coefficients can be updated (training of the equalizer) such that the output of the equalizer 340 may track the output of the second ADC 322. Since the second digital data, used by the equalizer 340, may be affected by errors, the equalized output signal after equalizer correction may be also affected by errors.

Figure 5:
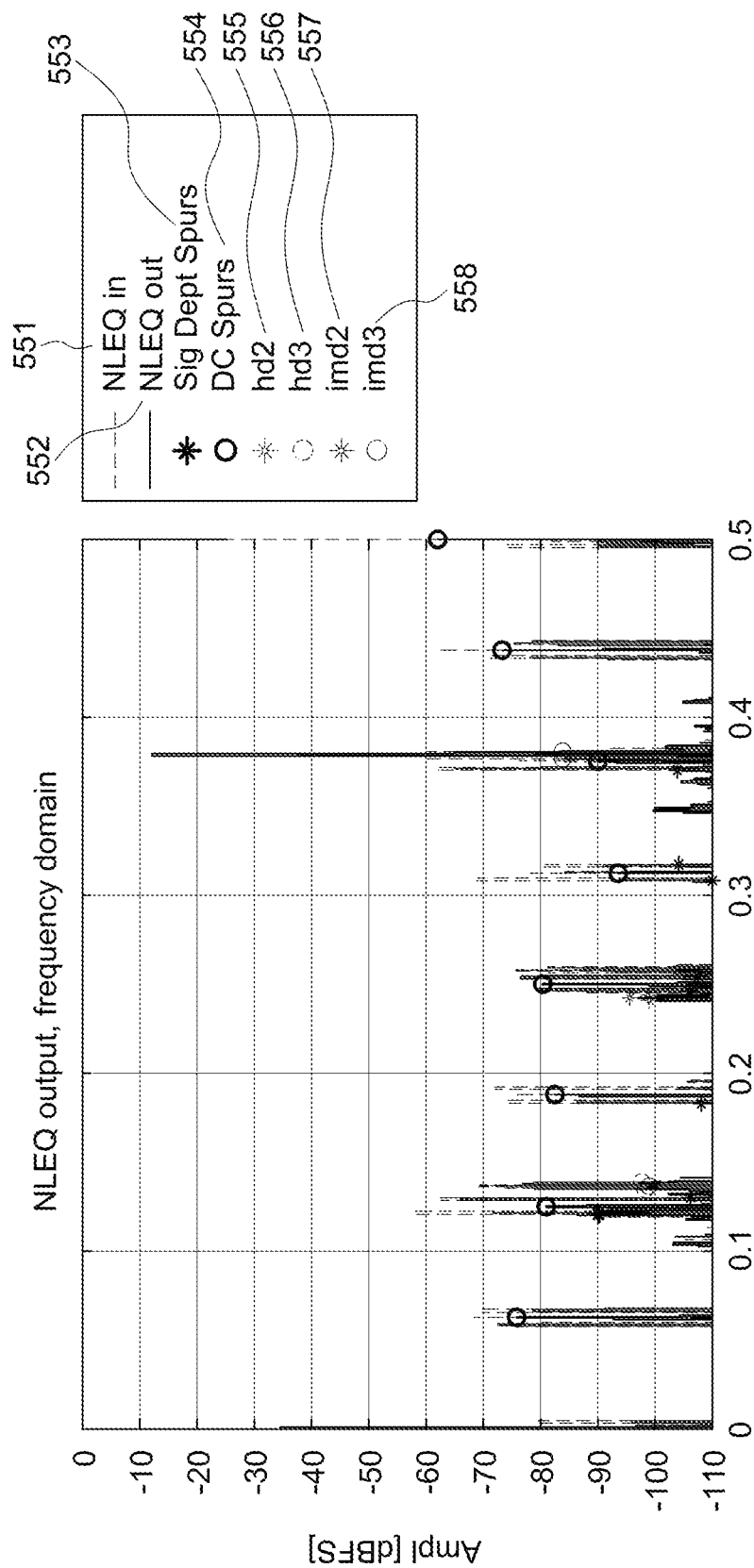
FIG. 5 illustrates an input and an output of the equalizer according to the examples of FIGS. 3 and 4.

FIG. 5 exemplarily shows an input and an output (in the frequency domain) of the equalizer 340 of the ADC system 350, described in connection with FIGS. 3 and 4 and comprising a sampling frequency of $f_S$ and N=16 sub-ADCs. FIG. 5 shows the overall response of the ADC system 350 to a high frequency two-tone input signal. According to the example, the equalized output signal is dominant at a normalized frequency around 0.38 with an amplitude of approximately −12 dBFS. Signals referring to 551 exemplarily illustrate the input of the equalizer 340 in the frequency domain. The equalized output signal 552 comprises a spectrum of spurs such as signal dependent spurs 553, spurs 555, 556 due to (second, third) harmonic distortion, and spurs 557, 558 due to (second, third) intermodulation distortion. Further, significant spurs (called discrete, DC, spurs) can be observed due to the crosstalk between the first ADC 302 and the second ADC 322. These unwanted spurs are generated at frequencies $f=k \cdot f_s/N$ where $k=[0 \ldots N/2]$ due to the periodic activation of the sub-ADCs in the first ADC 302. The amplitudes of the DC spurs are more dominant compared to the other observable spurs 553, 555-558. Further, simulations showed that the crosstalk may depend on the slice activation sequence. The crosstalk may be independent of the input signal (received by the first signal path 310 and second signal path 320) being converted by the ADC system 350. In other words, the activation of a sampler in the first ADC 302 may generate the crosstalk, while the amplitude and/or frequency of the input signal being sampled may have no impact on the observed DC spurs in the second digital data. The amplitude of the DC-spurs may vary if the sequential slice activation sequence is changed.

Figure 6:
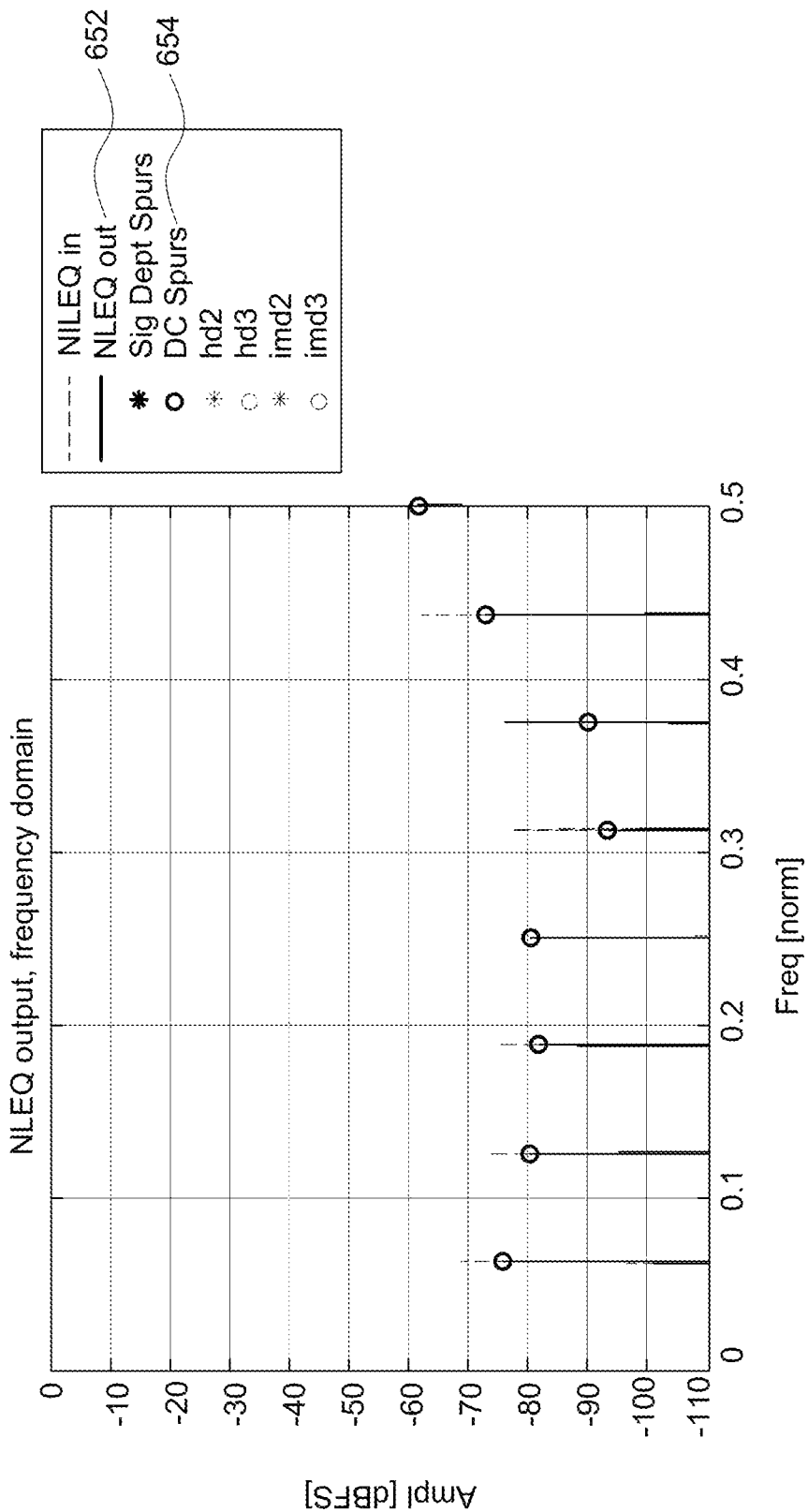
FIG. 6 illustrates an output of the equalizer according to the examples of FIGS. 3 and 4 and if no input signal is applied.

FIG. 6 illustrates the equalized output signal of the equalizer 340, described in conjunction with FIG. 3, if no input signal is applied to the ADC system 350. As it can be seen, only the DC spurs 654 are visible in the equalized output signal 652 of the equalizer 340. Even if no input signal is applied, the DC spurs may remain due to the sampling (or activity) of the sub-ADCs of the first ADC 302. Hence, a crosstalk can occur and generate DC spurs in the second digital data regardless of the input signal.

Figure 7:
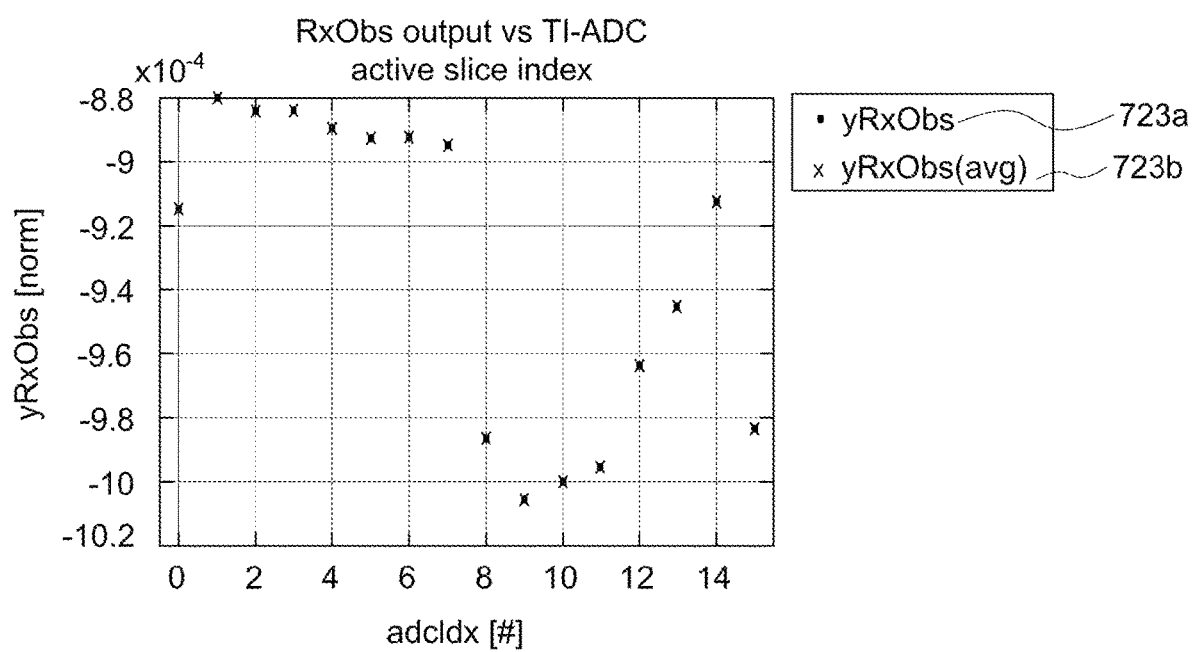
FIG. 7 illustrates second digital data dependent on the index referring to the currently active sub-ADC according to the examples of FIGS. 3 and 4.

For the case that no input signal is applied, FIG. 7 illustrates the second digital data (amplitude of the output of the second ADC 322 referred by 723*a* and the average amplitude by 723*b*) with respect to an index (referred by "adcIdx") of the active sub-ADC. For example, the index of the active sub-ADC may be according to the successive arrangement of sub-ADCs as shown in FIG. 4. According to FIG. 7, second digital data is measurable and significant even when no input signal is applied to the ADC system 350. Further, the amplitude of the second digital data changes (e.g. increases or decreases) if another sub-ADC (e.g. the next neighboring sub-ADC or an arbitrary sub-ADC of the first ADC 302) becomes active. FIG. 7 may show the distribution of errors in the second digital data due to the crosstalk of the first ADC 302 and second ADC 320 in dependence of the active sub-ADC. For example, when the (next) sub-ADC n becomes active (with $0 \le n \le N-1$), the second digital data is shifted up or down by a fix amount indicating that the crosstalk might generate an offset. Since the first ADC 302 comprises e.g. N sub-ADCs, N discrete shifts or offsets may be observable in the second digital data.

The proposed ADC systems (e.g. ADC system 100, 200 described in conjunction with FIG. 1 or 2) may provide a better technique for analog-to-digital conversion and may provide a correction scheme for DC-offsets observable in conventional ADC systems as described in conjunction with FIG. 3 to 7.

As stated above, the correction circuit 130 (e.g. of the ADC system 100 or 200) may comprise one or more LUTs to supply the correction data 132 e.g. based on one or more selected entries of the LUT(s). In the following, aspects of the LUTs are described in further detail according to different implementations in conjunction with the FIG. 8 to 11.

Figure 8:
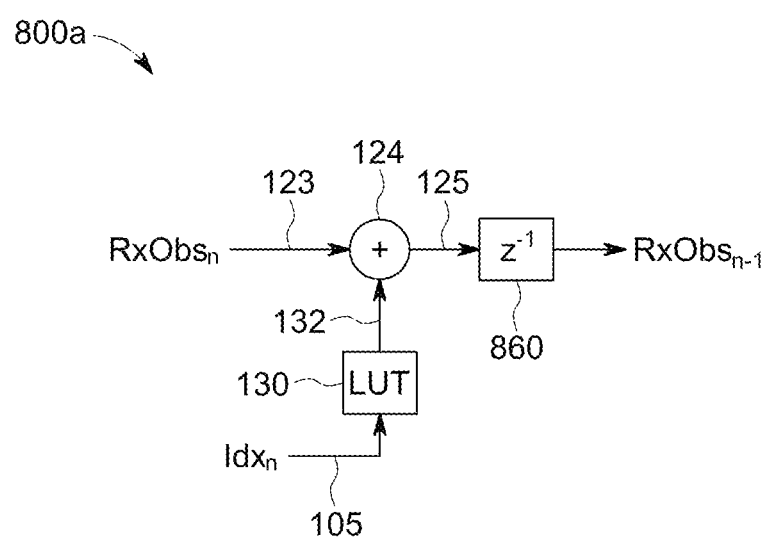
FIG. 8 illustrates an exemplary implementation of (a part of) the proposed ADC system.

FIG. 8 illustrates an exemplary implementation of (a part of) an ADC system 800*a* according to the proposed technique. The (part of the) ADC system 800*a* may be implemented similar to (a part of the) ADC system 100 or 200 (the part at least comprising the correction circuit 130 and the combiner circuit 124) described in conjunction with FIGS. 1 and/or 2. According to FIG. 8, the correction circuit 130 comprises a LUT and the correction circuit 130 is configured to select an entry of the LUT based on the sub-ADC indicated as currently active in the activity data 105 and output the selected entry of the LUT as the correction data 132. For example, one entry of the LUT may refer to an offset in the second digital data for a specific (index $idx_n$ of a) sub-ADC being currently active. The circuitry 104 (see FIG. 1 or 2) may generate the activity data 105 comprising information on the specific sub-ADC being currently active. The correction circuit 130 may receive the activity data 105 and select the corresponding entry in the LUT. The corresponding entry in the LUT, being the correction data 132, may indicate an (unwanted) offset to be combined with the (error-prone) second digital data 123 by the combiner circuit 124 to obtain the modified second digital data 125. A digital delay element 860 may indicate a delay of the modified second digital data 125 e.g. by one sample in the digital domain, until the modified digital data 125 is passed to the equalizer. According to the example given in FIG. 8, a simple and fast correction scheme may be implementable by only considering a current activity of sub-ADCs. This may be achievable since previously active sub-ADC might be not considered for generating the modified second digital data 125. Further, the LUT may be simple and easier to implement since only current (rather than a previous) activity of sub-ADCs are considered. For example, the LUT is a one-dimensional (1D) LUT comprising N entries. N being the number of sub-ADCs of the first ADC.

FIG. 8 may refer to a basic (or simple) digital correction scheme being based on $$\text{offs} = \text{LUT}[idx_n],$$

wherein "offs" indicates an entry or an offset in the LUT dependent on the currently active sub-ADC referred by its corresponding index $idx_n$. Depending on which sub-ADC is active, the combiner circuit combines the corresponding entry with the second digital data.

Figure 9:
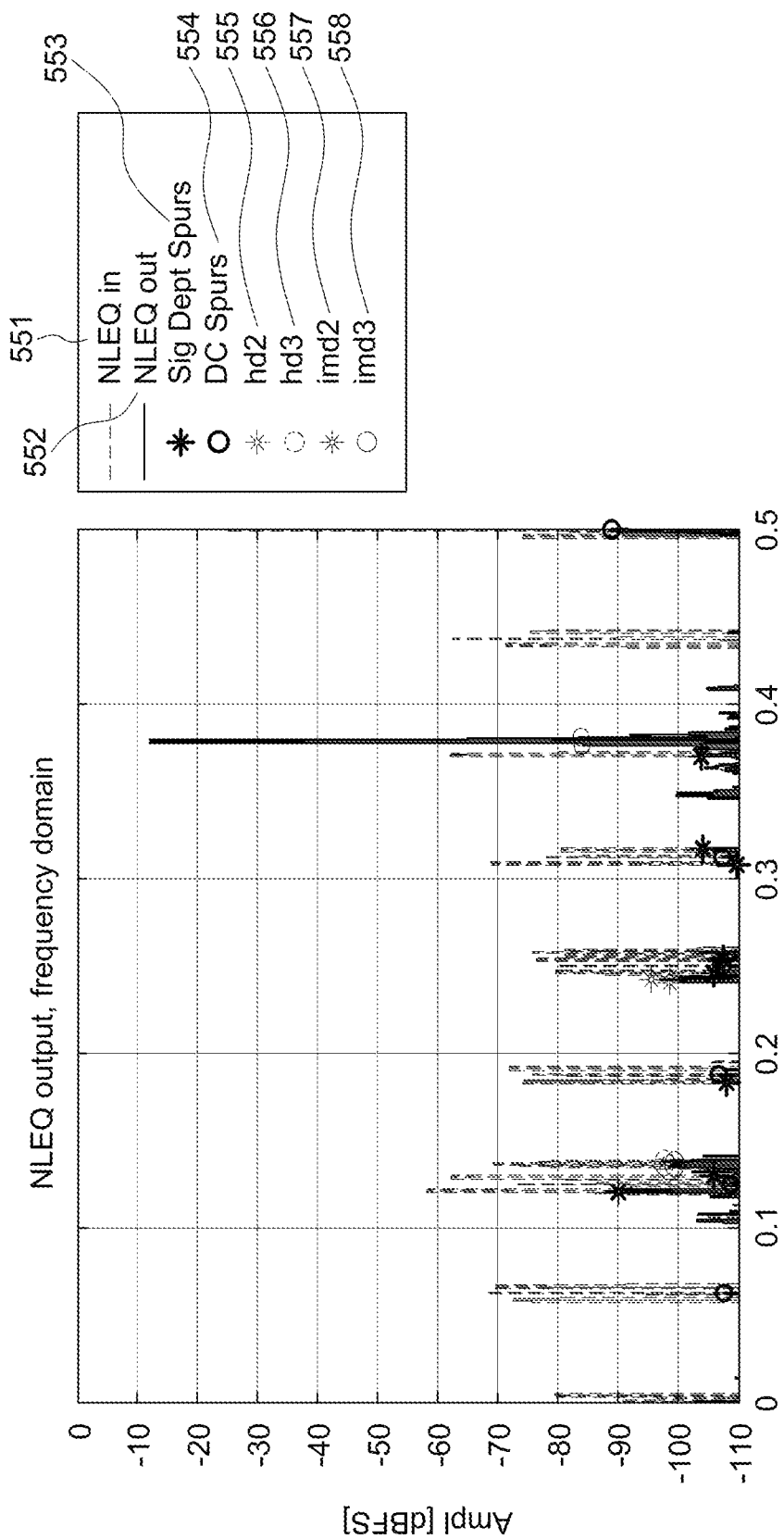
FIG. 9 illustrates an input and an output of the equalizer according to the example of FIG. 8.

FIG. 9 shows an input and an output of the equalizer 140 of an ADC system according to the proposed technique and according to the implementation described in conjunction with FIG. 8. Types of the signals referred by 551-558 may be similar to the types of the signals described in conjunction with FIG. 5. Compared to the DC spurs in the output of the equalizer 340 of the conventional ADC system as shown in FIG. 5, DC spurs in the output of the equalizer 140 of the ADC system (e.g. ADC system 100 or 200) according to the proposed technique can be significantly lower. The amplitudes of the DC spurs are reduced by >15 dB and are hence significantly smaller than the DC amplitudes observed in a conventional ADC system.

The 1D-LUT correction scheme, described in conjunction with FIG. 8, may refer to a static correction scheme, e.g. usable for a single sequential slice activation sequence. During the operation of the ADC system (or the first ADC), the first ADC may change the slice activation sequence. For example, if the first ADC comprises N=5 sub-ADCs with slice indices $idx_0$-$idx_4$, a first slice activation sequence may be sequence #1=[$idx_0$, $idx_1$, $idx_2$, $idx_3$, $idx_4$,], a second slice activation sequence may be sequence #2=[$idx_2$, $idx_3$, $idx_0$, $idx_1$, $idx_4$,] and further slice activation may be according to other possible permutations. A different crosstalk might be generated for a permutation of the indices which is altering the order by which the slices are activated. If the slice activation sequence is changed, the correction circuit may use another LUT corresponding to the current slice activation sequence. By this, spurs in the second digital data may be reduced or removed more efficiently.

If several slice activation sequences are possible, the correction circuit 130 may comprise more than one 1D-LUTs. The correction circuit 130 may apply a new LUT entry (a new LUT may be different from an initially or previously applied LUT) at the (exact) moment where the slice activation sequence is changed. Hence, synchronization issues may be avoidable by implementing e.g. 2 look-up tables LUT1 and LUT2, containing the optimal correction entries for the 2 sequential slice activation sequences "sequence #1" and "sequence 2", respectively. When the slice activation sequence is changed (sequence #1→sequence #2), the correction circuit may switch the look-up tables (LUT1→LUT2). If two or more slice activation sequences are possible, the correction circuit 130 may switch between M≥2 LUTs.

Figure 10:
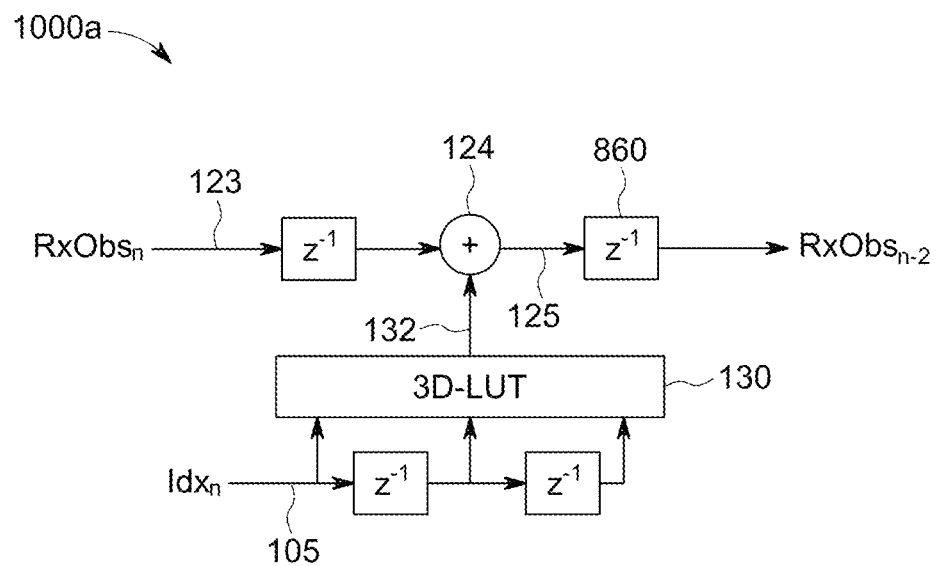
FIG. 10 illustrates another exemplary implementation of (a part of) the proposed ADC system.

FIG. 10 illustrates another exemplary implementation of (a part of) an ADC system 1000a according to the proposed technique. The (part of the ADC) system 1000a may be implemented similar to (a part of) the ADC system 100 or 200 described in conjunction with FIGS. 1 and 2 and/or the implementation 800a described in conjunction with FIG. 8. According to FIG. 10, the correction circuit 130 comprises a look-up table (e.g. three-dimensional, 3D, LUT). The correction circuit 130 is configured to select an entry of the look-up table based on the sub-ADC indicated as currently active in the activity data 105 and the one or more previously active sub-ADCs indicated in the activity data 105. The correction circuit 130 is further configured to output the selected entry of the look-up table as the correction data 132.

For example, one entry of the 3D-LUT may refer to an offset in the second digital data for a specific (index of a) sub-ADC being currently active and one or more specific sub-ADCs which were being previously active. As exemplarily shown in FIG. 10, the correction circuit may receive information on the currently active sub-ADC ($1^{st}$ input) and two previously active sub-ADCs ($2^{nd}$ and $3^{rd}$ input). The correction circuit 130 receives k (in FIG. 10 k=3) inputs and selects the corresponding entry in the 3D-LUT. The corresponding entry of the LUT, being the correction data 132, may indicate an (unwanted) offset to be combined with the (error-prone) second digital data 123 by the combiner circuit 124 to obtain the modified second digital data 125.

Compared to the implementation described in conjunction with FIG. 8, the correction scheme according to FIG. 10 may use a single (multi-dimensional) LUT even if a slice activation sequence in the ADC system is changed. Further, synchronization problems due to application of different LUTs for different slice activation sequences may be reduced or avoided. The correction scheme of FIG. 10 may supply correction data based on a memory since previously active sub-ADCs are considered.

Due to the memory in the correction scheme, a hardware of the correction circuit may be simplified or less complex. For example, the offset to be applied does not only depend on the current active slice index $idx_n$, but on a sequence of k subsequent indices. For k=3, the correction scheme may become $$\text{offs}=\text{LUT}[idx_{n-1}, idx_n, idx_{n+1}]$$

and the correction hardware may now require a 3D-LUT (k=3 inputs, 1 output), as depicted in FIG. 10.

The depth of the memory may determine the dimension of the LUT being used. For example, the look-up table is of dimension $N^k$ with N being the number of sub-ADCs of the first ADC and k−1 being the number of the one or more previously active sub-ADCs indicated in the activity data.

Figure 11:
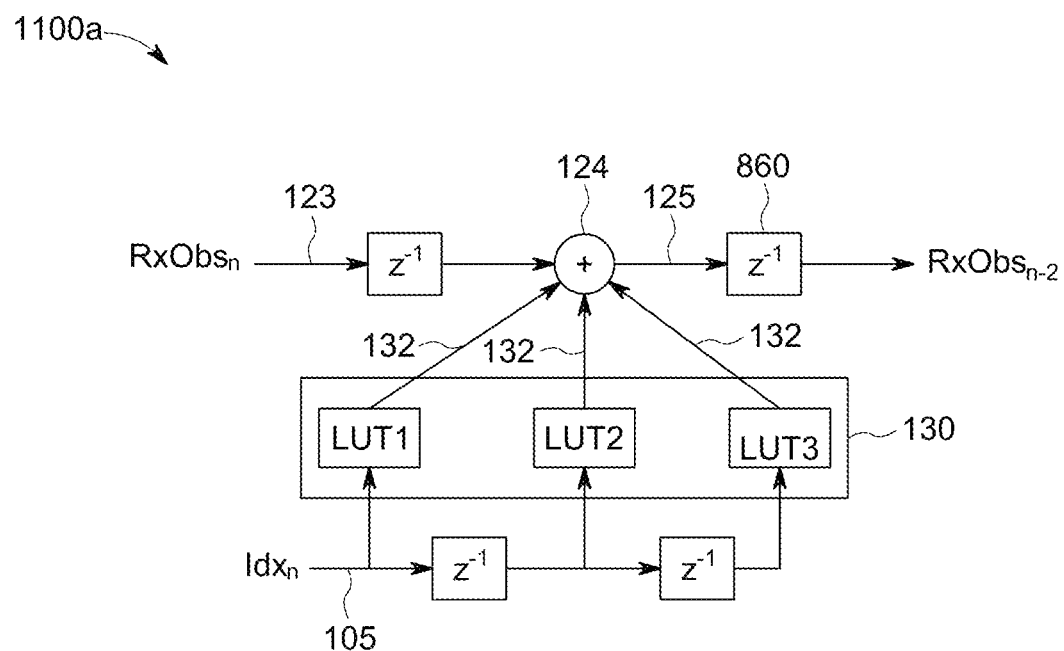
FIG. 11 illustrates another exemplary implementation of (a part of) the proposed ADC system.

FIG. 11 illustrates another exemplary implementation of (a part of) an ADC system 1100a according to the proposed technique. The (part of the) ADC system 1100a may be implemented similar to (a part of) the ADC system 100 or 200 described in conjunction with FIGS. 1 and 2 and/or the implementation described in conjunction with FIG. 8 or 10. As exemplary illustrated in FIG. 11, the correction circuit 130 comprises k=3 look-up tables. According to another example, the correction circuit may comprise k LUTs and with k=1 indicating the basic digital correction scheme described in conjunction with FIG. 8. The correction circuit 130 is configured to select a respective entry of each of the k look-up tables based on respective one of the sub-ADC indicated as currently active in the activity data 105 and the one or more previously active sub-ADCs indicated in the activity data 105. The correction circuit 130 is further configured to output the selected entries of the k look-up tables as the correction data 132.

For example, one entry of a first LUT may be selected according to a sub-ADC being currently active, one entry of a second LUT may be selected according to a sub-ADC which was being previously active to the currently active sub-ADC and one entry of a third LUT may be selected according to a sub-ADC which was active previous to the (first) previously active sub-ADC. For the given example, the correction circuit 130 receives k=3 inputs and selects the corresponding entry in the LUTs, respectively. The selected entries may be the correction data 132 which can be further used by the combiner circuit 124 to generate the modified second digital data 125.

Compared to the implementation described in conjunction with FIG. 10, the correction scheme according to FIG. 11 may use a number of 1D-LUT rather than a multi-dimensional LUT to consider different slice activation sequences in the ADC system. For example, the k look-up tables are one-dimensional look-up tables each comprising N entries. N being the number of sub-ADCs of the first ADC and k−1 being the number of the one or more previously active sub-ADCs indicated in the activity data. Since the LUT size, $N^k$, for the correction scheme described in conjunction with FIG. 10, can become large for a higher memory depth, the correction circuit may be implementable more efficiently if the technique described in conjunction with FIG. 11 is applied. The technique of the correction scheme of FIG. 11 may be based on the superposition principle and, for e.g. k=3, the offset can be rewritten as $$\text{offs}=\text{LUT1}[idx_{n+1}]+\text{LUT2}[idx_n]+\text{LUT3}[idx_{n-1}]$$

Hence, the offset is a combination of k 1D-LUTs. Compared to the above correction scheme using a $N^k$ dimensional LUT, the correction scheme of FIG. 11 may only need an overall LUT size of k·N.

FIG. 11 may refer to an improved digital correction scheme with several 1D-LUTs. This proposed correction scheme may correct any sequential slice activation sequence (e.g. static activation of the ADC slices, usually employed during regular operation), transitions between sequential slice activation sequences (e.g. dynamic activation of the ADC slices, usually employed during background calibration of the first ADC) and/or any random slice activation sequence ("scrambling").

For example, the depth of the memory (e.g. k) can be chosen as a tradeoff between desired correction and complexity of the implementation. For example, the depth of memory may be increased linearly with the number N of the sub-ADCs of the first ADC.

For example, the LUT entries may be determined as follows:

The input of the second signal path may be disconnected from the (RF) input signal. This may be similar or equivalent to provide a zero-analog input to the second ADC. By keeping the first ADC active (e.g. samplers enabled), the second ADC may be activated to collect the output samples (or the second digital data). Knowing the value of the second ADC output $yRxObs_n$ and the sequence of the corresponding, e.g. k=3 indices [$idx_{n-1}$, $idx_n$, $idx_{n+1}$], LUT entries can be calculated. For the calculation, a software with, e.g. Least-Square (LS) algorithm can be used. The software may operate on the (whole) data capture (offline computation). Optionally, a runtime computation can be performed for the calculation of the LUT entries by e.g. a dedicated hardware implementing a Least Mean Square (LMS) filter. For example, offline computation may be performed to provide a basic data set for the one or more LUTs. Run time computation can be performed to adjust or optimize the basic data set e.g. with respect to temperature related offset drifts.

The validity of the proposed k·1D-LUT approach may be verifiable by transistor level simulations of a time-interleaved ADC with e.g. N=16 sub-ADCs. For example, a value of k=3 1D-LUTs can be a good compromise between offset correction and hardware complexity for a desired spurious free dynamic range (SFDR) target.

The Verification May Proceed as Follows:

An initial simulation may be performed, e.g. with zero input, while the first ADC is active. (Optimal) LUT entries may be calculated with Least-Square (LS) from the captured datastream. Several simulations may be performed, e.g. each time with a different slice activation sequence. The second digital data may be corrected e.g. with the (single) set of parameters calculated previously. SFDR of the TI-ADC output after equalizer correction may be evaluated on each simulation.

Figure 12A:
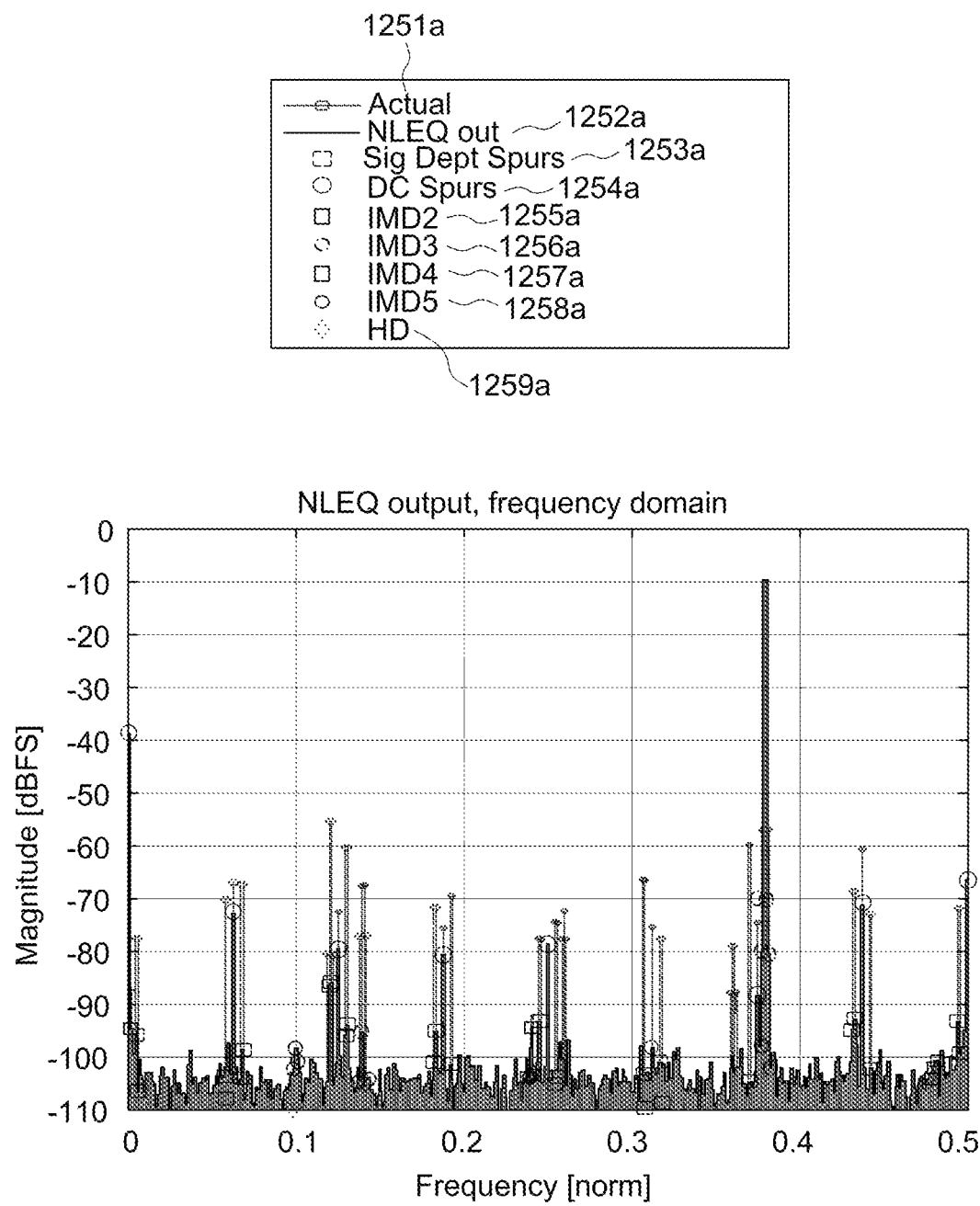
FIG. 12a-b illustrate an input and an output of the equalizer according to another example.

FIG. 12a shows an input 1251a and an equalized output signal 1252a of an equalizer of an ADC system according to the implementation described in conjunction with FIG. 11. In FIG. 12a, the first ADC was operated sequentially with a predefined sequential slice activation sequence (sequence #1). Further, the correction circuit (and/or combiner circuit) was deactivated such that a DC-offset correction was disabled. According to FIG. 12a, the equalized output signal 1252a comprises a spectrum of spurs such as signal dependent spurs 1253a, spurs 1255a to 1258a due to (second, third, fourth, fifth) intermodulation distortion or spurs 1259a of higher order. Further, discrete, DC, spurs 1254a can be observed due to the crosstalk between the first ADC and the second ADC. Magnitudes of the DC spurs 1254a are dominant with respect to the target signal with a magnitude of around −10 dBFS.

Figure 12B:
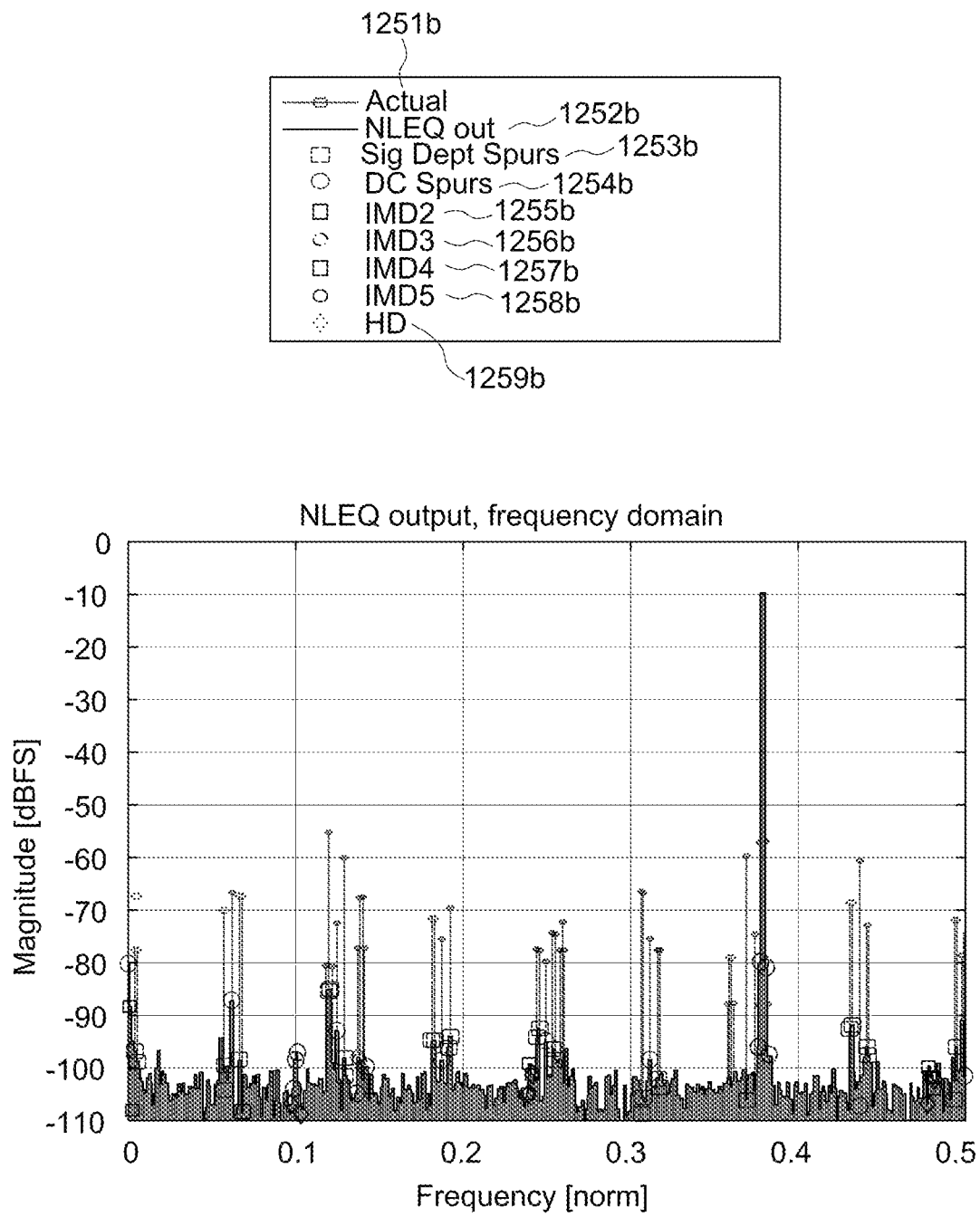

FIG. 12b shows the input 1251b and the equalized output signal 1252b (comprising the respective spurs 1253b-1259b) of the equalizer of the ADC system described in conjunction with FIG. 12a and with the correction circuit (and/or combiner circuit) being activated such that a DC-offset correction is enabled. Comparing the DC-offsets in FIG. 12a and FIG. 12b, the proposed technique for DC-offset correction may reduce the DC-spurs by >20 dB.

Figure 13A:
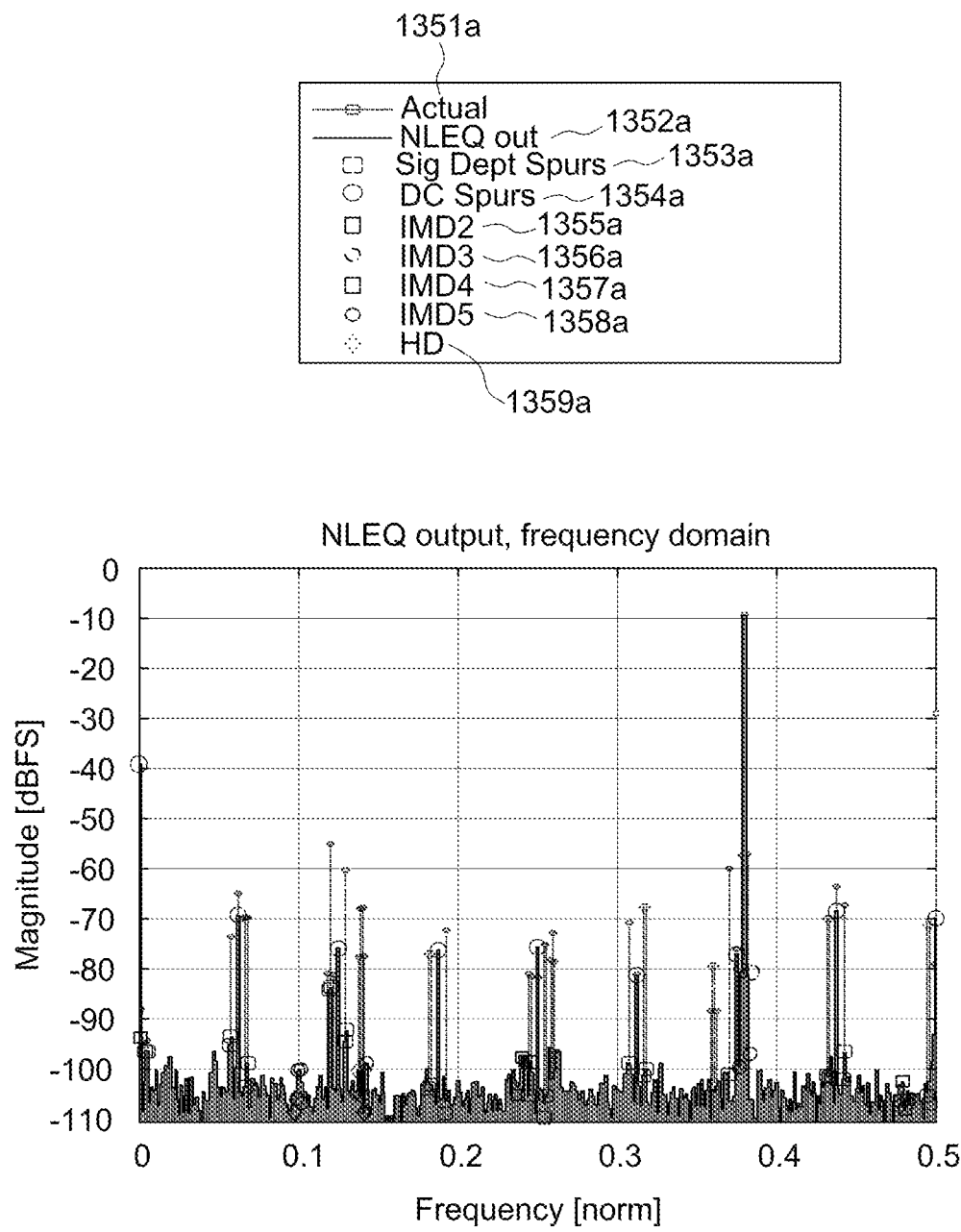
FIG. 13a-b illustrate an input and an output of the equalizer according to another example.

FIG. 13a shows an input 1351a and an equalized output signal 1352a (comprising the respective spurs 1353a-1359a) of an equalizer of an ADC system described in conjunction with FIG. 12a (with the correction circuit and/or combiner circuit being deactivated such that a DC-offset correction is disabled) and with a different sequential slice activation sequence (e.g. sequence #2 being different from sequence #1). Compared to FIG. 12a, the amplitudes of the DC-offset spurs are different. This indicates that the sequence of activated sub-ADCs may have an impact on the errors observed in the second digital data. Hence, correction of second digital data by using correction data based on a memory (i.e. considering previously active sub-ADCs) may be more efficient.

Figure 13B:
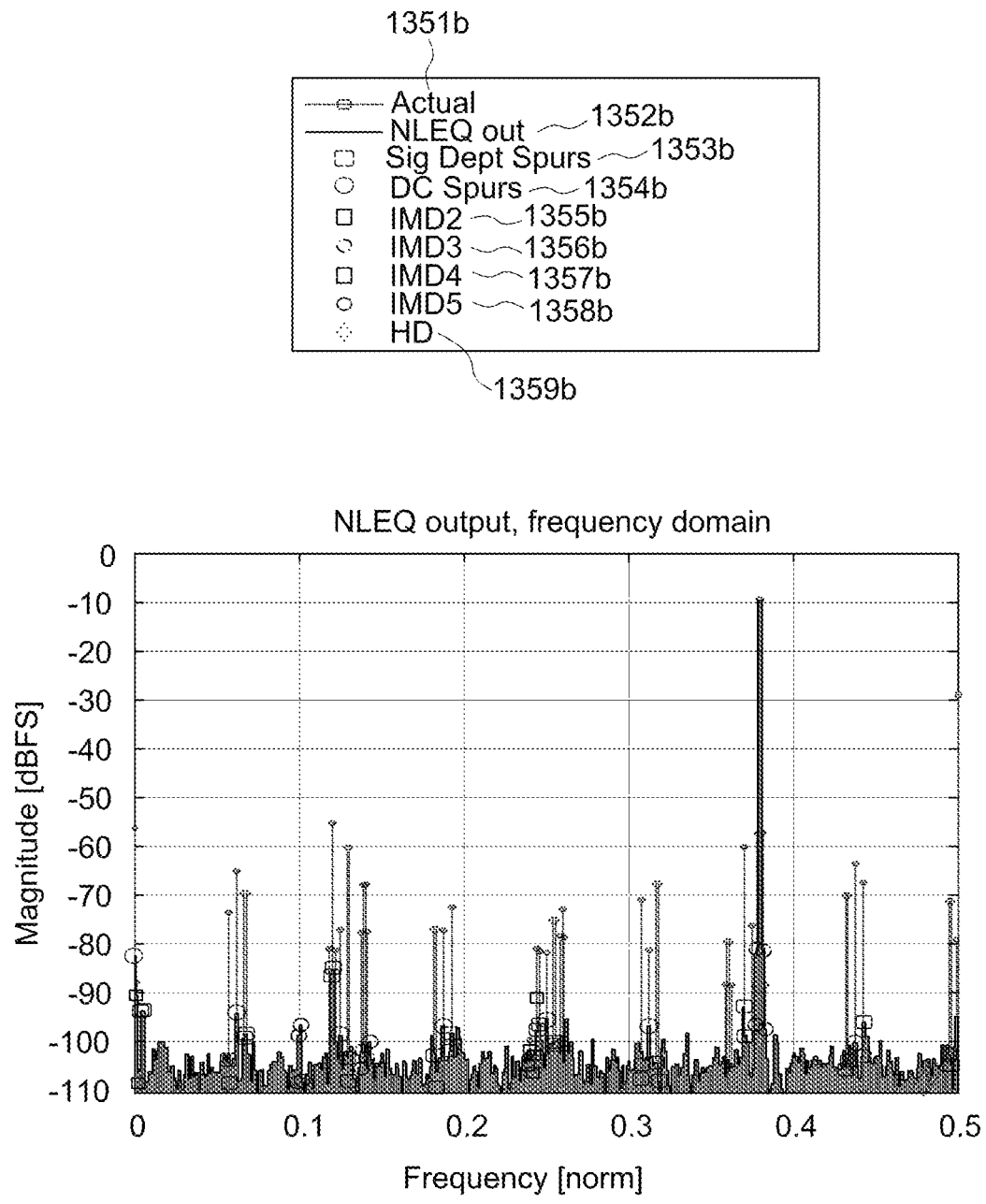

FIG. 13b shows the input 1351b and the equalized output signal 1352b (comprising the respective spurs 1353b-1359b) of the equalizer of the ADC system described in conjunction with FIG. 13a and with the correction circuit (and/or combiner circuit) being activated such that a DC-offset correction is enabled. Comparing the DC-offsets in FIG. 13a and FIG. 13b, the proposed technique for DC-offset correction may (still) reduce the DC-spurs by >20 dB for a different slice activation sequence.

Figure 14A:
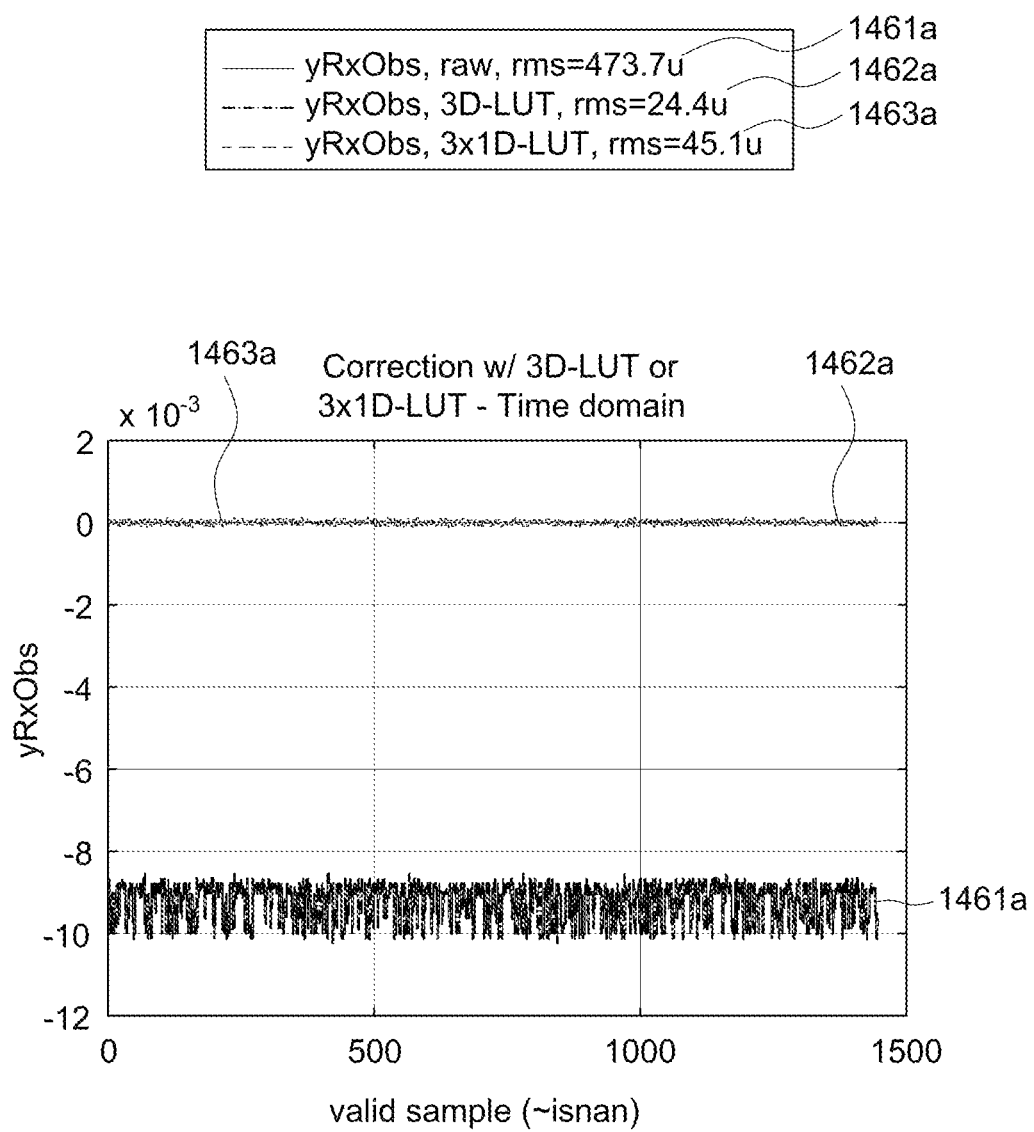
FIG. 14a illustrates an output of the equalizer in the time domain according to an example.
Figure 14B:
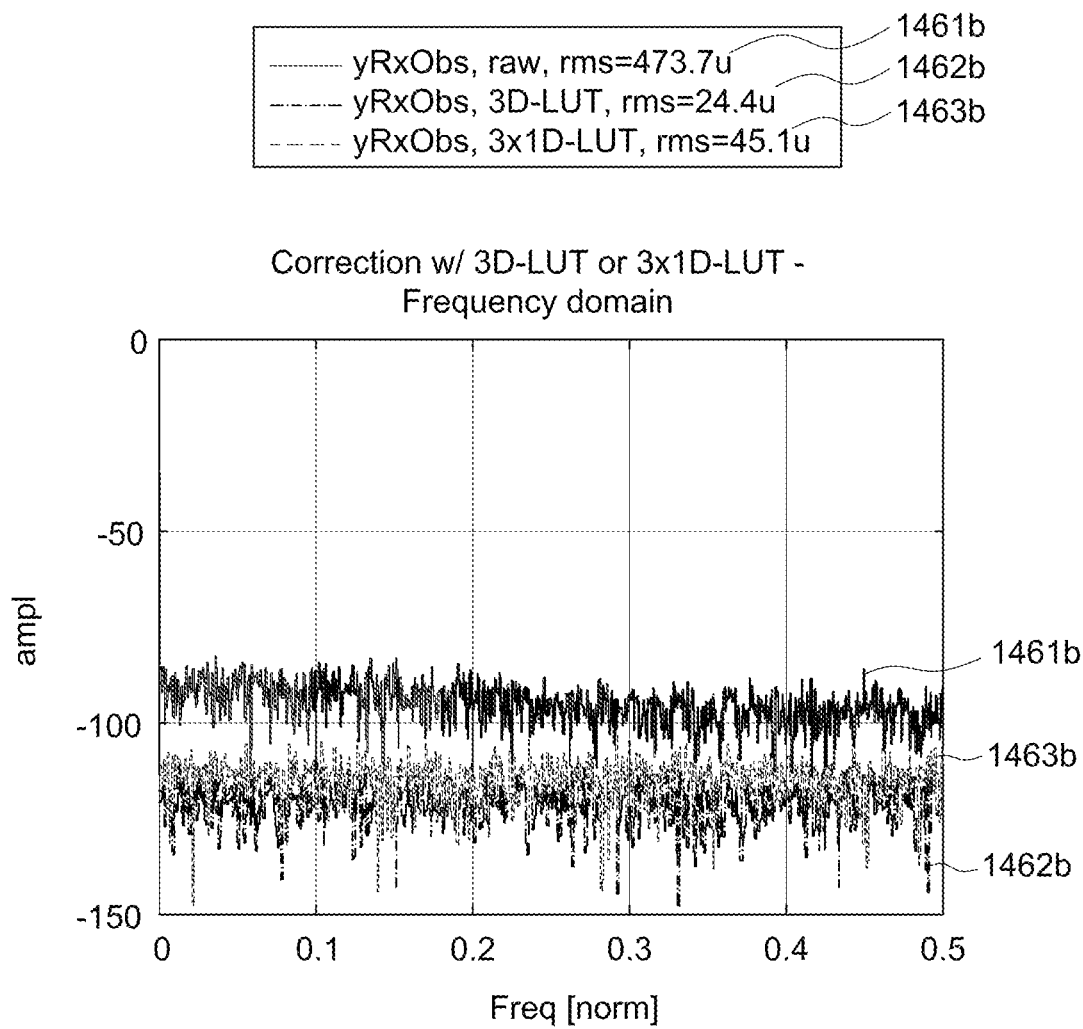

FIG. 14a-b show the equalized output signal in the time domain (FIG. 14a) and frequency domain (FIG. 14b). The equalized output signal is generated by activating the slices in the first ADC randomly (scrambling). Further, no input signal is applied to the ADC system. The equalized output signals 1461a, 1461b refer to the uncalibrated (or uncorrected) raw output (without DC-spur correction), the equalized output signals 1462a, 1462b refer to the calibrated output (with DC-spur correction with a correction circuit using a 3D-LUT) and the equalized output signals 1463a, 1463b refer to the calibrated output (with DC-spur correction with a correction circuit using a 3×1D-LUTs). FIG. 14a shows that the uncorrected equalized output signal 1461a comprises a large DC offset and a large root mean square (rms) variation. FIG. 14b shows that for the uncorrected equalized output signal 1461b, the noise-floor in frequency domain is high. When the calibration scheme is activated, the DC offset is removed and the rms variation is reduced by >10× of the uncorrected signal. Further, the noise-floor in the frequency domain is reduced. Comparing both correction schemes (3D LUT vs. 3×1D LUTs), the 3D-LUT approach may provide a better correction. Still, the 3×1D-LUTs approach may provide a very good correction and may further enable a lower complexity of the correction circuit (or ADC system).

An example of an implementation using analog-digital conversion according to one or more aspects of the ADC system described above in connection with FIG. 1, 2, 8, 10 or 11 or one or more examples described above in connection with FIG. 1, 2, 8, 10 or 11 is illustrated in FIG. 15.

FIG. 15 schematically illustrates an example of a radio base station 1570 (e.g. for a femtocell, a picocell, a microcell or a macrocell) comprising an ADC system 1500 as proposed. A receiver 1571 of the base station 1570 comprises the ADC system 1500. The receiver 1571 additionally comprises analog circuitry 1574 configured to receive a RF receive signal from at least one antenna element 1573 of the base station 1570. The analog circuitry 1574 is further configured to supply the input signal to the ADC system 1500 based on the RF receive signal. The ADC system 1500 generates digital data based on the input signal. For example, the analog circuitry 1574 may be an analog RF front-end and comprising one or more of a Low-Noise Amplifier (LNA), filter, a down-conversion mixer, Electro Static Discharge (ESD) protection circuitry, an attenuator etc. Further, the base station 1570 comprises a transmitter 1572 configured to generate a RF transmit signal. The transmitter 1572 may use the antenna element 1573 or another antenna element (not illustrated) of the base station 1570 for radiating the RF transmit signal to the environment.

To this end, a base station with improved analog-to-digital conversion capabilities may be provided.

The base station 1570 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I2C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 16:
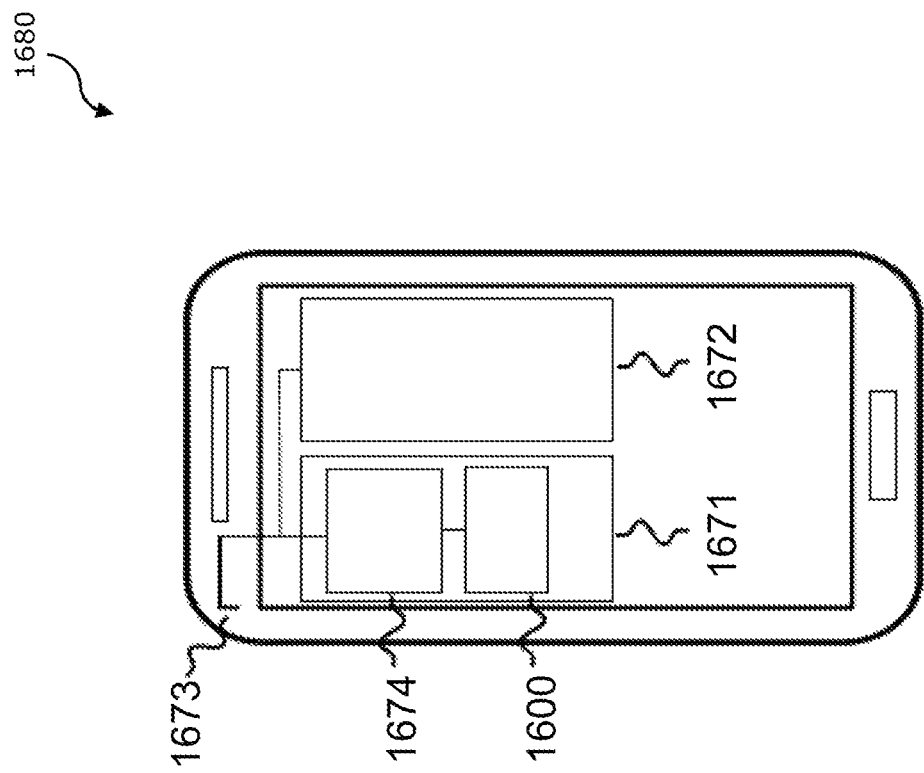
FIG. 16 illustrates an example of a mobile device.
Figure 17:
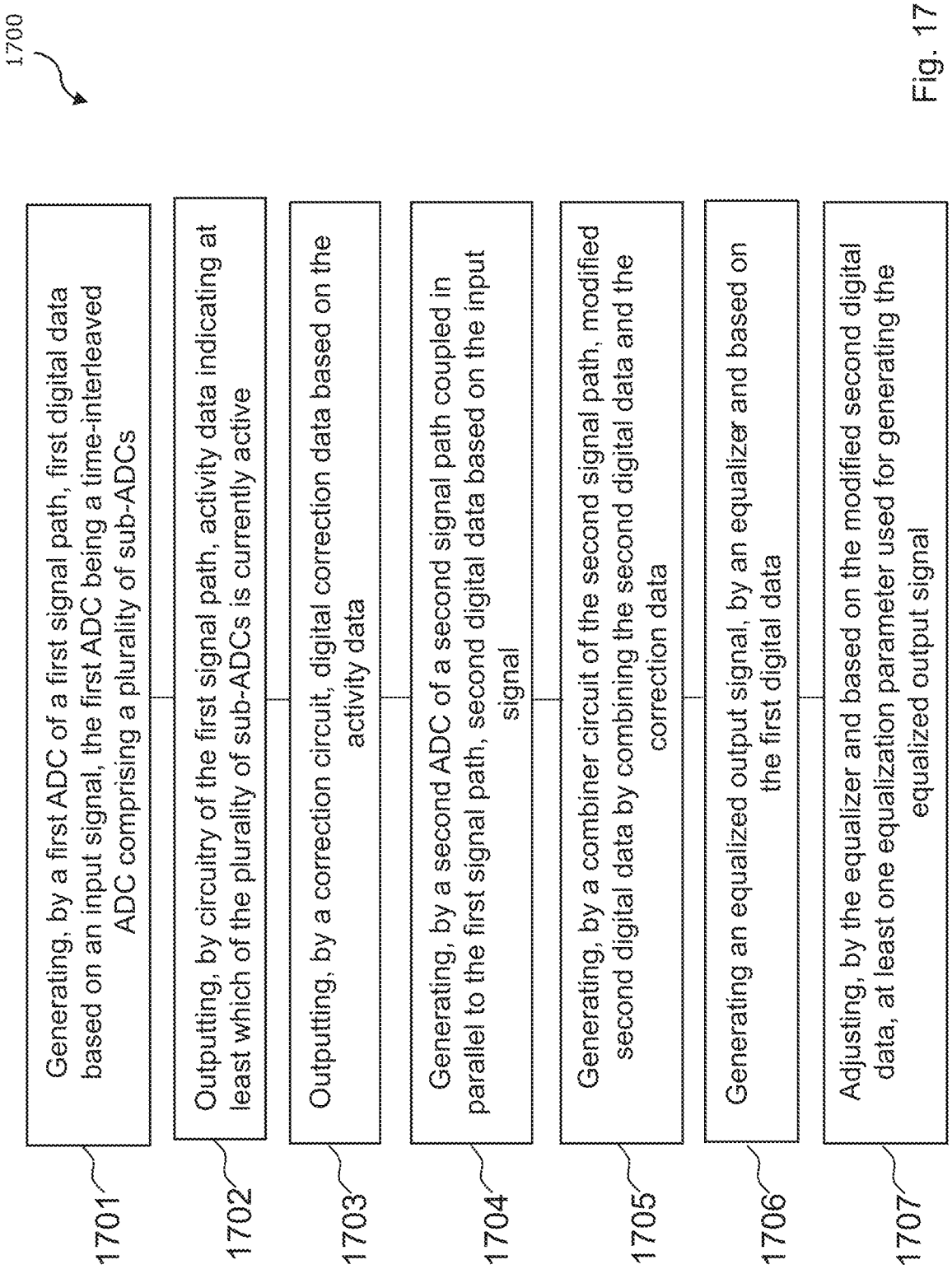
FIG. 17 illustrates a flowchart of an example of a method for analog-to-digital conversion.

Another example of an implementation using analog-to-digital conversion according to one or more aspects of the ADC system described above in connection with FIG. 1, 2, 8, 10 or 11 or one or more examples described above in connection with FIG. 1, 2, 8, 10 or 11 is illustrated in FIG. 16. FIG. 16 schematically illustrates an example of a mobile device 1680 (e.g. mobile phone, smartphone, tablet-computer, or laptop) comprising an ADC system 1600 as proposed.

A receiver 1671 of the mobile device 1680 comprises the ADC system 1600. The receiver 1671 additionally comprises analog circuitry 1674 configured to receive an RF receive signal from at least one antenna element 1673 of the mobile device 1680. The analog circuitry 1674 is further configured to supply the input signal to the ADC system 1600 based on the RF receive signal. The ADC system 1600 generates digital data based on the input signal. For example, the analog circuitry 1674 may be an analog RF front-end and comprise one or more of a LNA, a filter, a down-conversion mixer, ESD protection circuitry, an attenuator etc.

Further, the mobile device 1680 comprises a transmitter 1672 configured to generate an RF transmit signal. The transmitter 1672 may use the antenna element 1673 or another antenna element (not illustrated) of the mobile device 1680 for radiating the RF transmit signal to the environment.

To this end, a mobile device with improved analog-to-digital conversion capabilities may be provided.

The mobile device 1680 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I2C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using analog-to-digital conversion according to the proposed technique or one or more of the examples described above may be configured to operate according to one of the 3rd Generation Partnership Project (3GPP)-standardized mobile communication networks or systems. The mobile or wireless communication system may correspond to, for example, a 5th Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

However, it is to be noted that the proposed ADC system may be used not only in receivers for wireless signals. The proposed ADC system may, for example, be used for high precision instrumentation or wireline receivers as well. Therefore, examples of the present disclosure further relate to a receiver comprising an ADC system as proposed herein and analog circuitry configured to receive a receive signal from a wired transmission link. The analog circuitry is configured to supply the input signal to the ADC system based on the receive signal. For example, the analog circuitry may comprise one or more of a LNA, a filter, a down-conversion mixer, ESD protection circuitry, an attenuator etc. Further, examples relate to any electronic device comprising the proposed ADC system.

For further illustrating the analog-to-digital conversion described above, FIG. 17 illustrates a flowchart of a method 1700 for analog-to digital conversion. The method 1700 comprises generating 1701, by a first ADC of a first signal path, first digital data based on an input signal. The first ADC is a time-interleaved ADC comprising a plurality of sub-ADCs. The method 1700 further comprises outputting 1702, by circuitry of the first signal path, activity data indicating at least which of the plurality of sub-ADCs is currently active. The method 1700 further comprises outputting 1703, by a correction circuit, digital correction data based on the activity data and generating 1704, by a second ADC of a second signal path coupled in parallel to the first signal path, second digital data based on the input signal. The method 1700 further comprises generating 1705, by a combiner circuit of the second signal path, modified second digital data by combining the second digital data and the correction data.

Further, the method 1700 comprises generating 1706 an equalized output signal, by an equalizer and based on the first digital data. The method 1700 further comprises adjusting 1707, by the equalizer and based on the modified second digital data, at least one equalization parameter used for generating the equalized output signal.

Optionally the method 1700 further comprises subtracting the digital correction data from the second digital data or adding the digital correction data to the second digital data.

The method 1700 may allow to correct unwanted spurs in the second digital data caused by the crosstalk between the first (time-interleaved ADC) in the first signal path and a second ADC in the second signal path of the ADC system. Accordingly, errors in the equalized output signal of the equalizer may be reduced or be avoided.

More details and aspects of the method 1700 are explained in connection with the proposed technique or one or more examples described above (e.g. FIG. 1, 2, 8, 10 or 11). The method 1700 may comprise one or more additional optional features corresponding to one or more aspects of the proposed technique or one or more examples described above.

Some examples relate to a (crosstalk based) DC-offset cancellation in a receiver (Rx) observation path.

According to the proposed technique, a single set of LUTs may cancel the crosstalk for any arbitrary slice activation sequence. For example, there may be no need to update the LUT entries if the slice activation sequence changes.

In some aspect, the proposed technique may enable to suppress the crosstalk also in case of random activation of the TI-ADC slices (scrambling). LUT entries can be calculated offline (Least Square) or by a dedicated hardware (Least Mean Square).

For example, aspects of the ADC systems may be detectable by reverse engineering such as visual or X-ray die inspection. This may reveal the existence of a path connecting the first ADC output (where the active slice sequence might be detected) to the second ADC output (where the offset may be, e.g. subtracted). The path between the first signal path and the second signal path for providing the correction data as proposed may comprise a logic to capture the sequence of the last k active slices, a mux for LUT indices generation, one or more correction LUTs and a combiner circuit (e.g. an adder) to combine the correction data.

In some examples, the proposed technique may provide a correction scheme without (significantly) increasing the ADC noise-floor, increasing the area in which the sub-ADCs in the first ADC are arranged, increasing the layout complexity of the first ADC, decreasing a matching among the first signal path and the second signal path.

In some examples, the proposed technique may provide a correction scheme without the need to characterize the effects of crosstalk at manufacturing and may provide a dynamic (rather than a static) correction usable for several different slice activation sequences.

The examples described herein may be summarized as follows:

An example (e.g. example 1) relates to an analog-to-digital converter, ADC, system, comprising a first signal path. The first signal path comprises a first ADC configured to generate first digital data based on an input signal. The first ADC is a time-interleaved ADC comprising a plurality of sub-ADCs. The first signal path further comprises circuitry configured to output activity data indicating at least which of the plurality of sub-ADCs is currently active. The ADC system further comprises a correction circuit configured to output digital correction data based on the activity data. Further, the ADC system comprises a second signal path coupled in parallel to the first signal path. The second signal path comprises a second ADC configured to generate second digital data based on the input signal and a combiner circuit configured to generate modified second digital data by combining the second digital data and the correction data. The ADC system further comprises an equalizer configured to generate an equalized output signal of the ADC system based on the first digital data. The equalizer is configured to adjust, based on the modified second digital data, at least one equalization parameter used for generating the equalized output signal of the ADC system.

Another example (e.g. example 2) relates to a previously described example (e.g. example 1), wherein the first ADC is configured to sample the input signal at a first sampling frequency and the second ADC is configured to sample the input signal at a second sampling frequency being lower than the first sampling frequency.

Another example (e.g. example 3) relates to a previously described example (e.g. one of the examples 1-2), wherein the combiner circuit is configured to generate modified second digital data by subtracting the correction data from the second digital data or adding the correction data to the second digital data.

Another example (e.g. example 4) relates to a previously described example (e.g. one of the examples 1-3), wherein the correction circuit comprises a look-up table, and the correction circuit is configured to select an entry of the look-up table based on the sub-ADC indicated as currently active in the activity data and output the selected entry of the look-up table as the correction data.

Another example (e.g. example 5) relates to a previously described example (e.g. example 4), wherein the look-up table is a one-dimensional look-up table comprising N entries, N being the number of sub-ADCs of the first ADC.

Another example (e.g. example 6) relates to a previously described example (e.g. one of the examples 1-3), wherein the activity data further indicate one or more previously active sub-ADCs of the plurality of sub-ADCs.

Another example (e.g. example 7) relates to a previously described example (e.g. example 6), wherein the correction circuit comprises a look-up table, and the correction circuit is configured to select an entry of the look-up table based on the sub-ADC indicated as currently active in the activity data and the one or more previously active sub-ADCs indicated in the activity data. The correction circuit is further configured to output the selected entry of the look-up table as the correction data.

Another example (e.g. example 8) relates to a previously described example (e.g. example 7), wherein the look-up table is of dimension $N^k$ with N being the number of sub-ADCs of the first ADC and k−1 being the number of the one or more previously active sub-ADCs indicated in the activity data.

Another example (e.g. example 9) relates to a previously described example (e.g. example 6), wherein the correction circuit comprises k look-up tables, and the correction circuit is configured to select a respective entry of each of the k look-up tables based on respective one of the sub-ADC indicated as currently active in the activity data and the one or more previously active sub-ADCs indicated in the activity data. The correction circuit is further configured to output the selected entries of the k look-up tables as the correction data.

Another example (e.g. example 10) relates to a previously described example (e.g. example 9), wherein the k look-up tables are one-dimensional look-up tables each comprising N entries, N being the number of sub-ADCs of the first ADC and k−1 being the number of the one or more previously active sub-ADCs indicated in the activity data.

Another example (e.g. example 11) relates to a previously described example (e.g. one of the examples 1-10), wherein the circuitry is configured to determine the activity data based on the first digital data.

Another example (e.g. example 12) relates to a previously described example (e.g. one of the examples 1-11), wherein the first signal path further comprises a first buffer circuit configured to buffer the input signal, and an input of the first ADC is coupled to an output of the first buffer circuit.

Another example (e.g. example 13) relates to a previously described example (e.g. one of the examples 1-12), wherein the second signal path further comprises an attenuator circuit configured to attenuate the input signal and a second buffer circuit configured to buffer the input signal. An input of the second ADC is coupled to an output of the second buffer circuit. An input of the second buffer circuit is coupled to an output of the attenuator circuit.

An example (e.g. example 14) relates to a receiver comprising: an ADC system relating to a previously described example (e.g. one of the examples 1-13); and analog circuitry configured to receive a receive signal and to supply the input signal to the ADC system based on the receive signal.

Another example (e.g. example 15) relates to a previously described example (e.g. example 14), wherein the input signal is a radio frequency signal.

An example (e.g. example 16) relates to a base station, comprising: a receiver relating to a previously described example (e.g. one of the examples 14-15); and a transmitter configured to generate a radio frequency transmit signal.

Another example (e.g. example 17) relates to a previously described example (e.g. example 16), further comprising: at least one antenna element coupled to at least one of the receiver and the transmitter.

An example (e.g. example 18) relates to a mobile device, comprising: a receiver relating to a previously described example (e.g. one of the examples 14 to 15); and a transmitter configured to generate a radio frequency transmit signal.

Another example (e.g. example 19) relates to a previously described example (e.g. example 18), further comprising: at least one antenna element coupled to at least one of the receiver and the transmitter.

An example (e.g. example 20) relates to a method for analog-to-digital conversion, comprising: generating, by a first ADC of a first signal path, first digital data based on an input signal, the first ADC being a time-interleaved ADC comprising a plurality of sub-ADCs; outputting, by circuitry of the first signal path, activity data indicating at least which of the plurality of sub-ADCs is currently active; outputting, by a correction circuit, digital correction data based on the activity data; generating, by a second ADC of a second signal path coupled in parallel to the first signal path, second digital data based on the input signal; generating, by a combiner circuit of the second signal path, modified second digital data by combining the second digital data and the correction data; generating an equalized output signal, by an equalizer and based on the first digital data; and adjusting, by the equalizer and based on the modified second digital data, at least one equalization parameter used for generating the equalized output signal.

Another example (e.g. example 21) relates to a previously described example (e.g. example 20), wherein generating the modified second digital data comprises: subtracting the digital correction data from the second digital data or adding the digital correction data to the second digital data.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An analog-to-digital converter, ADC, system, comprising:
   a first signal path comprising:
      a first ADC configured to generate first digital data based on an input signal, the first ADC being a time-interleaved ADC comprising a plurality of sub-ADCs; and
      circuitry configured to output activity data indicating at least which of the plurality of sub-ADCs is currently active;
   a correction circuit configured to output digital correction data based on the activity data;
   a second signal path coupled in parallel to the first signal path, the second signal path comprising:
      a second ADC configured to generate second digital data based on the input signal; and
      a combiner circuit configured to generate modified second digital data by combining the second digital data and the correction data; and
   an equalizer configured to generate an equalized output signal of the ADC system based on the first digital data, wherein the equalizer is configured to adjust, based on the modified second digital data, at least one equalization parameter used for generating the equalized output signal of the ADC system.

2. The ADC system according to claim 1, wherein the first ADC is configured to sample the input signal at a first sampling frequency and the second ADC is configured to sample the input signal at a second sampling frequency being lower than the first sampling frequency.

3. The ADC system according to claim 1, wherein the combiner circuit is configured to generate modified second digital data by subtracting the correction data from the second digital data or adding the correction data to the second digital data.

4. The ADC system according to claim 1, wherein the correction circuit comprises a look-up table, and the correction circuit is configured to select an entry of the look-up table based on the sub-ADC indicated as currently active in the activity data and output the selected entry of the look-up table as the correction data.

5. The ADC system according to claim 4, wherein the look-up table is a one-dimensional look-up table comprising N entries, N being the number of sub-ADCs of the first ADC.

6. The ADC system according to claim 1, wherein the activity data further indicate one or more previously active sub-ADCs of the plurality of sub-ADCs.

7. The ADC system according to claim 6, wherein the correction circuit comprises a look-up table, and the correction circuit is configured to:
   select an entry of the look-up table based on the sub-ADC indicated as currently active in the activity data and the one or more previously active sub-ADCs indicated in the activity data; and
   output the selected entry of the look-up table as the correction data.

8. The ADC system according to claim 7, wherein the look-up table is of dimension $N^k$ with N being the number of sub-ADCs of the first ADC and k−1 being the number of the one or more previously active sub-ADCs indicated in the activity data.

9. The ADC system according to claim 6, wherein the correction circuit comprises k look-up tables, and the correction circuit is configured to:
   select a respective entry of each of the k look-up tables based on respective one of the sub-ADC indicated as currently active in the activity data and the one or more previously active sub-ADCs indicated in the activity data; and
   output the selected entries of the k look-up tables as the correction data.

10. The ADC system according to claim 9, wherein the k look-up tables are one-dimensional look-up tables each comprising N entries, N being the number of sub-ADCs of the first ADC and k−1 being the number of the one or more previously active sub-ADCs indicated in the activity data.

11. The ADC system according to claim 1, wherein the circuitry is configured to determine the activity data based on the first digital data.

12. The ADC system according to claim 1, wherein the first signal path further comprises a first buffer circuit configured to buffer the input signal, and an input of the first ADC is coupled to an output of the first buffer circuit.

13. The ADC system according to claim 1, wherein the second signal path further comprises an attenuator circuit configured to attenuate the input signal and a second buffer circuit configured to buffer the input signal,
   an input of the second ADC is coupled to an output of the second buffer circuit, and
   an input of the second buffer circuit is coupled to an output of the attenuator circuit.

14. A receiver, comprising:
   an ADC system according to claim 1; and
   analog circuitry configured to receive a receive signal and to supply the input signal to
   the ADC system based on the receive signal.

15. The receiver according to claim 14, wherein the input signal is a radio frequency signal.

16. A base station, comprising:
   a receiver according to claim 14; and
   a transmitter configured to generate a radio frequency transmit signal.

17. The base station according to claim 16, further comprising:

at least one antenna element coupled to at least one of the receiver and the transmitter.

18. A mobile device, comprising:
a receiver according to claim 14; and
a transmitter configured to generate a radio frequency transmit signal.

19. A method for analog-to-digital conversion, comprising:
generating, by a first ADC of a first signal path, first digital data based on an input signal, the first ADC being a time-interleaved ADC comprising a plurality of sub-ADCs;
outputting, by circuitry of the first signal path, activity data indicating at least which of the plurality of sub-ADCs is currently active;
outputting, by a correction circuit, digital correction data based on the activity data;
generating, by a second ADC of a second signal path coupled in parallel to the first signal path, second digital data based on the input signal;
generating, by a combiner circuit of the second signal path, modified second digital data by combining the second digital data and the correction data;
generating an equalized output signal, by an equalizer and based on the first digital data; and
adjusting, by the equalizer and based on the modified second digital data, at least one equalization parameter used for generating the equalized output signal.

20. The method according to claim 19, wherein generating the modified second digital data comprises:
subtracting the digital correction data from the second digital data or adding the digital correction data to the second digital data.

* * * * *